(12) United States Patent
Matsushita et al.

(10) Patent No.: US 11,062,880 B2
(45) Date of Patent: Jul. 13, 2021

(54) ION IMPLANTER

(71) Applicant: SUMITOMO HEAVY INDUSTRIES ION TECHNOLOGY CO., LTD., Tokyo (JP)

(72) Inventors: Hiroshi Matsushita, Ehime (JP); Ryota Ohnishi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/821,318

(22) Filed: Mar. 17, 2020

(65) Prior Publication Data
US 2020/0303163 A1    Sep. 24, 2020

(30) Foreign Application Priority Data

Mar. 19, 2019   (JP) .............................. JP2019-051014

(51) Int. Cl.
| | |
|---|---|
| *H01J 37/317* | (2006.01) |
| *H01J 37/20* | (2006.01) |
| *H01J 37/09* | (2006.01) |
| *G21K 1/10* | (2006.01) |
| *H01J 37/147* | (2006.01) |
| *H01J 37/304* | (2006.01) |
| *H01J 37/30* | (2006.01) |

(52) U.S. Cl.
CPC ............ *H01J 37/3171* (2013.01); *G21K 1/10* (2013.01); *H01J 37/09* (2013.01); *H01J 37/1472* (2013.01); *H01J 37/20* (2013.01); *H01J 37/30* (2013.01); *H01J 37/304* (2013.01); *H01J 2237/0473* (2013.01)

(58) Field of Classification Search
CPC ........ H01J 37/3171; H01J 37/20; H01J 37/09; H01J 37/1472; H01J 37/244; H01J 37/30; H01J 37/304; H01J 2237/0473; G21K 1/10
USPC ...................................................... 250/492.21
See application file for complete search history.

(56) References Cited

U.S. PATENT DOCUMENTS

| | | | |
|---|---|---|---|
| 10,354,835 B2 | 7/2019 | Matsushita | |
| 2018/0206323 A1* | 7/2018 | Kobernik | ................ H05H 3/06 |

(Continued)

FOREIGN PATENT DOCUMENTS

| | | |
|---|---|---|
| JP | H09-145871 A | 6/1997 |
| JP | H10-260295 A | 9/1998 |
| JP | 2008-232845 A | 10/2008 |

(Continued)

*Primary Examiner* — Kiet T Nguyen
(74) *Attorney, Agent, or Firm* — Michael Best & Friedrich LLP

(57) ABSTRACT

An ion implanter includes: a main body which includes a plurality of units which are disposed along a beamline along which an ion beam is transported, and a substrate transferring/processing unit which is disposed farthest downstream of the beamline, and has a neutron ray source in which a neutron ray is generated due to collision of a ultrahigh energy ion beam; an enclosure which at least partially encloses the main body; and a neutron ray scattering member which is disposed at a position where a neutron ray which is emitted from the neutron ray source is incident in a direction in which a distance from the neutron ray source to the enclosure is equal to or less than a predetermined value.

23 Claims, 9 Drawing Sheets

(56) References Cited

U.S. PATENT DOCUMENTS

2018/0308698 A1\* 10/2018 Bina .................. G21G 1/06
2020/0303161 A1\* 9/2020 Matsushita ......... H01J 37/1472

FOREIGN PATENT DOCUMENTS

JP       2014-089127 A    5/2014
JP       2018-206504 A    12/2018

\* cited by examiner

ION IMPLANTER

RELATED APPLICATIONS

The content of Japanese Patent Application No. 2019-051014, on the basis of which priority benefits are claimed in an accompanying application data sheet, is in its entirety incorporated herein by reference.

BACKGROUND

Technical Field

Certain embodiments of the present invention relate to an ion implanter.

Description of Related Art

In a semiconductor manufacturing process, for the purpose of changing conductivity, the purpose of changing the crystal structure of a semiconductor wafer, or the like, a process of implanting ions into the semiconductor wafer is carried out standardly. An apparatus which is used in this process is generally called an ion implanter. The ion implantation energy is determined according to a desired implantation depth of ions which are implanted near the surface of the wafer. An ion beam having low energy is used for implantation into a shallow region, and an ion beam having ultrahigh energy is used for implantation into a deep region.

Recently, for implantation into a deeper region, there is an increasing demand for so-called ultrahigh energy ion implantation which uses an ion beam having higher energy than in ultrahigh energy ion implantation of the related art. There is a possibility of a nuclear reaction induced in a case where ions accelerated to ultrahigh energy collides with members which are present in a beamline of an ion implanter. Depending on the nuclear reaction that occurs, radiation such as neutron rays can be generated.

SUMMARY

According to an embodiment of the present invention, there is provided an ion implanter including: a main body which includes a plurality of units which are disposed along a beamline along which an ion beam is transported, and a substrate transferring/processing unit which is disposed farthest downstream of the beamline, and has a neutron ray source in which a neutron ray is generated due to collision of a ultrahigh energy ion beam; an enclosure which at least partially encloses the main body; and a neutron ray scattering member which is disposed at a position where the neutron ray which is emitted from the neutron ray source is incident in a direction in which a distance from the neutron ray source to the enclosure is equal to or less than a predetermined value.

DETAILED DESCRIPTION

Figure 1:
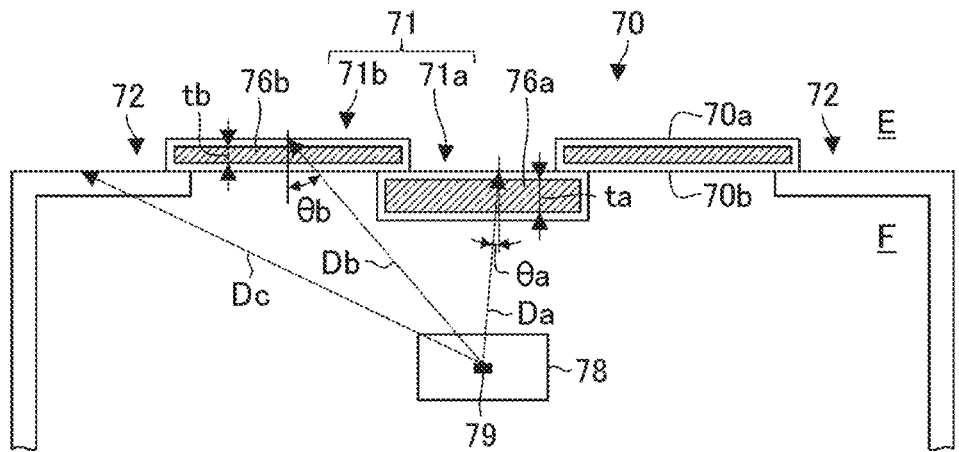
FIG. 1 is a diagram schematically showing a neutron ray scattering member which is provided in an enclosure.

In the case of an ultrahigh energy ion implanter in which generation of a neutron ray is a concern, it is also conceivable to install the entire implanter in a radiation controlled area. However, it is not easy to separately provide a radiation controlled area in a semiconductor manufacturing factory for mass production.

It is desirable to provide an ion implanter in which it is possible to suppress the neutron dose rate outside of the apparatus.

Any combination of the constituent elements described above, or replacement of constituent elements or expressions of the present invention with each other between methods, apparatuses, systems, or the like is also valid as an aspect of the present invention.

According to the present invention, an ion implanter in which a neutron dose rate outside of the implanter is suppressed can be provided.

Hereinafter, modes for carrying out the present invention will be described in detail with reference to the drawings. In the description of the drawings, the same elements are denoted by the same reference numerals, and overlapping description is omitted appropriately. Further, the configuration described below is an exemplification and does not limit the scope of the present invention.

This embodiment relates to an ion implanter for ultrahigh energy ion implantation. The ion implanter accelerates an ion beam extracted from in an ion source, transports a ultrahigh energy ion beam obtained by the acceleration to a workpiece (for example, a substrate or a wafer W) along a beamline, and implants ions into the workpiece.

The term "ultrahigh energy" in this embodiment refers to the energy of an ion beam having an energy of 4 MeV or higher, 5 MeV or higher, or 10 MeV or higher. According to implantation of the ultrahigh energy ion, since desired impurity ions are implanted into a wafer surface with higher energy than in ion implantation of an energy less than 4 MeV in the related art, it is possible to implant the desired impurities into a deeper region (for example, a depth of 5 μm or more) of the wafer surface. The use of the ultrahigh energy ion implantation is essential, for example, to forming a P-type region and/or an N-type region in the manufacture of a semiconductor device such as the newest image sensor.

In the ion implanter for ultrahigh energy ion implantation, a ultrahigh energy ion beam collides with constituent members of a beamline, whereby neutron rays can be generated. According to the knowledge of the inventors of the present invention, it is known that a neutron ray is generated in a case of using a boron ion beam having an energy of 4 MeV or higher. Specifically, with respect to boron $^{11}$B that is a non-radioactive nuclide, nuclear reactions which are represented by the following (1) and (2) can occur.

$$^{11}B + {}^{11}B \rightarrow {}^{21}Ne + n \qquad (1)$$

$$^{11}B + {}^{12}C \rightarrow {}^{22}Ne + n \qquad (2)$$

The above (1) is a nuclear reaction (also called a B-B reaction) in which boron $^{11}$B and boron $^{11}$B collide with each other to generate a neutron n. First, when an ion beam of boron $^{11}$B is incident on (collides with) the constituent member of the beamline, boron $^{11}$B is accumulated in a surface region of the constituent member. Thereafter, if the ion beam of boron $^{11}$B having ultrahigh energy collides with boron $^{11}$B accumulated in the surface region of the constituent member, the B-B reaction shown in the above (1) occurs to generate a neutron ray.

The above (2) is a nuclear reaction (also called a B-C reaction) in which boron $^{11}$B and carbon $^{12}$C collide with each other to generate a neutron n. Since at least apart of the constituent member of the beamline is made of graphite (that is, carbon), the ion beam of boron $^{11}$B having ultrahigh energy collides with the graphite, whereby the B-C reaction shown in the above (2) occurs to generate a neutron ray. Boron $^{11}$B is accumulated in the surface region of graphite, whereby a neutron ray due to the B-B reaction of the above (1) can also be generated.

In this manner, in the ion implanter for ultrahigh energy ion implantation, although a radioactive nuclide is not included in the implanted ion, the ultrahigh energy ion beam collides with various locations of the beamline, whereby radioactive nuclides are generated, so that neutron rays can be generated. Therefore, the ion implanter for ultrahigh energy ion implantation has a neutron ray source capable of generating a neutron ray due to collision of a ultrahigh energy ion beam. Therefore, in the ion implanter for ultrahigh energy ion implantation, it is necessary to appropriately manage the neutron ray which is generated at the neutron ray source.

In general, in a case of dealing with an apparatus in which radiation such as a neutron ray is generated, an operation method is considered in which a dedicated radiation controlled area is provided and the apparatus is installed in the area. However, it is not easy to separately provide the radiation controlled area in a semiconductor manufacturing factory for mass production. In the semiconductor manufacturing factory, it is necessary to transfer a wafer cassette or the like at any time between the ion implanter and other apparatus, and in a case where the ion implanter is installed in the radiation controlled area, the wafer cassette or the like is transferred between the controlled area and the non-controlled area. In order to appropriately shield the neutron ray, for example, a concrete wall having a thickness of several tens of centimeters or more is required, and a shielding door for loading and unloading the wafer cassette also becomes very thick. In this case, it is necessary to open and close the thick shielding door each time the wafer cassette is loaded and unloaded, which is a great labor. Further, if the operation of the ion implanter has to be stopped when the shielding door is open, the production efficiency of semiconductor devices is reduced. Therefore, the inventors of the present invention have considered to allow a neutron dose rate outside of the enclosure to fall below the reference value stipulated by laws and regulations or the like by mounting a neutron ray scattering member to the enclosure surrounding the outer periphery of a main body configuring a beamline.

As the radiation which is generated in the ion implanter for ultrahigh energy ion implantation, in addition to the neutron ray described above, X-rays is also involved. As an X-ray shielding member, a lead plate or the like is mounted to the enclosure. X-rays are easily shielded compared to the neutron ray, and X-rays going out of the enclosure can be sufficiently shielded by using a lead plate having a thickness in a range from about 1 mm to 5 mm, for example. On the other hand, it is not easy to reduce the neutron dose rate. For example, in a case where general high-density polyethylene (specific gravity: about 0.95 g/cm$^3$) is used as the neutron ray scattering member, a thickness in a range from about 150 mm to 200 mm is required in order to attenuate the neutron dose rate to $\frac{1}{10}$.

In order to reduce the neutron dose rate, it may be desirable to enclose the entire implanter with a thick neutron ray scattering member. However, in the ion implanter for ultrahigh energy ion implantation, since an acceleration unit for accelerating the ion beam to ultrahigh energy becomes large, the area occupied by the main body becomes the area of 10 m×20 m or more, for example, and the height of the main body also exceeds 2 m. For this reason, if a neutron ray scattering member having a large thickness is mounted over the entire implanter, a large amount of neutron ray scattering members are required, leading to a significant increase in cost and product weight, and thus, it is not preferable.

In this embodiment, rather than aiming to completely shield the neutron ray, the neutron ray scattering member is disposed mainly at a location where there is a concern that the neutron dose rate may exceed a predetermined reference value stipulated by laws and regulations or the like outside of the enclosure. Specifically, the disposition of the neutron ray scattering member is arranged according to the distance from the neutron ray source to the enclosure. This is because the neutron dose rate is inversely proportional to the square of the distance from the neutron ray source. The neutron dose rate increases at a location where the distance from the neutron ray source to the enclosure is small and decreases at a place where the distance from the neutron ray source to the enclosure is large.

The neutron dose rate which is generated in the neutron ray source in this embodiment is not so large, and for example, the neutron dose rate at the distance of about 1 m from the neutron ray source is in a range from about 0.1 to 2 µSv/h. Therefore, by disposing the neutron ray scattering member mainly at a location where the neutron dose rate is relatively high, it becomes possible to suppress the neutron dose rate outside of the enclosure to a value equal to or less than the reference value stipulated by laws and regulations or the like.

The "neutron ray scattering member" in this embodiment refers to a material having a large scattering effect with respect to a neutron ray. Hydrogen (H) or boron (B) is known as an element having a large neutron ray scattering effect, and a material having a high content of hydrogen and/or boron is preferable as the neutron ray scattering member. For example, as a material having high hydrogen density, polyolefin such as polyethylene or paraffin can be given, and a material having a hydrogen atom content in a range from 0.08 to 0.15 g/cm$^3$ is preferable. As a specific example, high-density polyethylene having a specific gravity in a range about from 0.94 to 0.97 g/cm$^3$ can be given. Further, as the neutron ray scattering member, a high-density polyethylene in which a boron compound such as a boron oxide ($B_2O_3$) is contained in a range about from 10% to 40% by weight may be used.

FIG. 1 is a diagram schematically showing neutron ray scattering members 76a and 76b which are provided in an enclosure 70. The enclosure 70 is disposed so as to surround the circumference of a device 78 configuring a beamline, and separates an external space E and an internal space F from each other. A neutron ray source 79 is present in the interior of the device 78. The enclosure 70 has an outer surface 70a which is exposed to the external space E and an inner surface 70b which is exposed to the internal space F. The neutron ray scattering members 76a and 76b are provided inside of the enclosure 70, that is, between the outer surface 70a and the inner surface 70b of the enclosure 70.

The enclosure 70 has an accommodation part 71 (also simply referred to as an accommodation part) in which the neutron ray scattering members 76a and 76b are provided, and a non-accommodation part 72 in which a neutron ray scattering member is not provided. The accommodation part 71 includes a first accommodation part 71a in which a first neutron ray scattering member 76a having a relatively large thickness to is provided, and a second accommodation part 71b in which a second neutron ray scattering member 76b having a relatively small thickness tb is provided.

The first neutron ray scattering member 76a is disposed in a first direction (arrow Da) in which the distance from the neutron ray source 79 to the outer surface 70a of the enclosure 70 is a first distance, and is disposed at a position where a neutron ray which is emitted in the first direction from the neutron ray source 79 can be incident. The second neutron ray scattering member 76b is disposed in a second direction (arrow Db) in which the distance from the neutron ray source 79 to the outer surface 70a of the enclosure 70 is a second distance larger than the first distance, and is disposed at a position where a neutron ray which is emitted in the second direction from the neutron ray source 79 can be incident. The thickness to of the first neutron ray scattering member 76a is, 100 mm or more, for example, in a range about from 200 mm to 500 mm. On the other hand, the thickness tb of the second neutron ray scattering member 76b is, 50 mm or more, for example, in a range about from 100 mm to 200 mm. The first distance (Da) is, for example, less than 2 m, less than 1.5 m, or less than 1 m, and the second distance (Db) is, for example, less than 10 m or less than 5 m, and is, for example, 2 m or more, 1.5 m or more, or 1 m or more.

A neutron ray scattering member is not disposed in a third direction (arrow Dc) in which the distance from the neutron ray source 79 to the outer surface 70a of the enclosure 70 is a third distance larger than the first distance and the second distance. The third distance (Dc) is, for example, 5 m or more, 10 m or more, or 15 m or more. Therefore, in this embodiment, the neutron ray scattering member is disposed in a direction in which the distance from the neutron ray source 79 to the outer surface 70a of the enclosure 70 is equal to or less than a predetermined value (for example, the second distance), and the neutron ray scattering member is not disposed in a direction in which the distance from the neutron ray source 79 to the outer surface 70a of the enclosure 70 exceeds another predetermined value (for example, the third distance).

It can be said that the first neutron ray scattering member 76a is disposed at a location where an angle difference $\theta a$ between the thickness direction of the scattering member and the first direction (arrow Da) from the neutron ray source 79 toward the outer surface 70a of the enclosure 70 is small. On the other hand, it can be said that the second neutron ray scattering member 76b is disposed at a location where an angle difference $\theta b$ between the thickness direction of the scattering member and the second direction (arrow Db) from the neutron ray source 79 toward the outer surface 70a of the enclosure 70 is large. Since the neutron ray which is directed from the neutron ray source 79 toward the first neutron ray scattering member 76a can be incident on the first neutron ray scattering member 76a at an approximately right angle, the effective thickness (ta/cos($\theta a$)) through which the neutron ray passes and the actual thickness to of the scattering member are approximately equal to each other. On the other hand, since the neutron ray which is directed from the neutron ray source 79 toward the second neutron ray scattering member 76b can be obliquely incident on the second neutron ray scattering member 76b, the effective thickness (tb/cos($\theta b$)) through which the neutron ray passes is larger than the actual thickness tb of the scattering member. For this reason, even if the second neutron ray scattering member 76b having the relatively small thickness tb is used, the neutron dose rate in the external space E outside of the enclosure 70 can be effectively reduced.

In the example of FIG. 1, the first accommodation part 71a and the second accommodation part 71b are disposed adjacently to each other, and the first accommodation part 71a and the second accommodation part 71b are disposed so as to at least partially overlap each other in the thickness direction or the direction from the neutron ray source 79 toward the outer surface 70a. Further, the first neutron ray scattering member 76a which is provided in the first accommodation part 71a and the second neutron ray scattering member 76b which is provided in the second accommodation part 71b are disposed so as to at least partially overlap each other in the thickness direction or the direction from the neutron ray source 79 toward the outer surface 70a. In this way, it is possible to prevent a neutron ray having a high dose rate from leaking to the external space E through the gap between the first accommodation part 71a and the second accommodation part 71b.

In the example of FIG. 1, the thicknesses of the neutron ray scattering members 76a and 76b are changed in two stages. However, the thickness of the neutron ray scattering member may be changed in three or more stages, or the thickness of the neutron ray scattering member may be continuously changed. Further, in the first accommodation part 71a and the second accommodation part 71b, plate-shaped or block-shaped neutron ray scattering members having desired thicknesses ta and tb may be used, or a plurality of plate-shaped or block-shaped neutron ray scattering members thinner than the desired thicknesses ta and tb may be used to overlap each other in the thickness direction.

Figure 2:
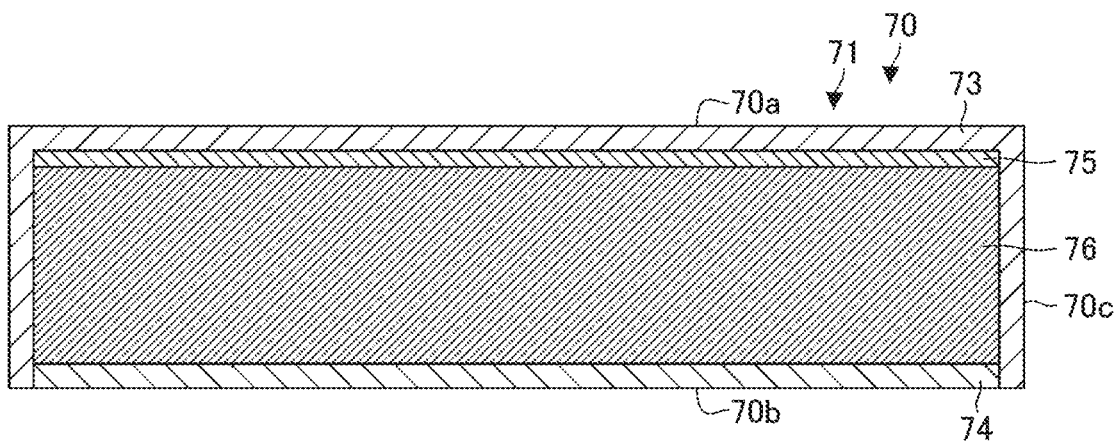
FIG. 2 is a cross-sectional view schematically showing a structure of an accommodation part.

FIG. 2 is a diagram showing the structure of the accommodation part 71 in detail. The accommodation part 71 has a main body frame 73 and a lid plate 74. An X-ray shielding member 75 and a neutron ray scattering member 76 are provided in the interior of the accommodation part 71. The main body frame 73 is a support structure for supporting the X-ray shielding member 75 and the neutron ray scattering member 76, and configures the outer surface 70a and a side surface 70c of the accommodation part 71. The lid plate 74 is mounted to the opening of the main body frame 73 and configures the inner surface 70b of the accommodation part 71. The main body frame 73 and the lid plate 74 are made of a metal material such as iron or aluminum. The X-ray shielding member 75 and the neutron ray scattering member 76 are disposed to overlap each other in the thickness direction, and are disposed, for example, such that the X-ray shielding member 75 is on the outer surface 70a side and the neutron ray scattering member 76 is on the inner surface 70b side. The X-ray shielding member 75 is, for example, a lead plate, and the neutron ray scattering member 76 is, for example, a plate-shaped or block-shaped high-density polyethylene. Instead of providing the lid plate 74, an incombustible sheet may be attached to the surface on the inner surface 70b side of the neutron ray scattering member 76. Further, an incombustible sheet may be additionally mounted between the lid plate 74 and the neutron ray scattering member 76. The incombustible sheet is a sheet-like member which does not burn for a certain period of time (for example, 20 minutes) in a case of being heated, and for example, a polyvinyl chloride (PVC) resin sheet, a resin sheet having glass fibers as a base material, a metal sheet, or the like can be given.

The non-accommodation part 72 can be configured in the same manner as the accommodation part 71 except that the neutron ray scattering member 76 is not provided in the interior thereof. The non-accommodation part 72 has, for example, the main body frame 73 and the lid plate 74 shown in FIG. 2, and the X-ray shielding member 75 is provided in the interior of the non-accommodation part 72. The thickness of the non-accommodation part 72 may be the same as the thickness of the accommodation part 71 or may be smaller than the thickness of the accommodation part 71. The interior of the non-accommodation part 72 may be a cavity.

Figure 3:
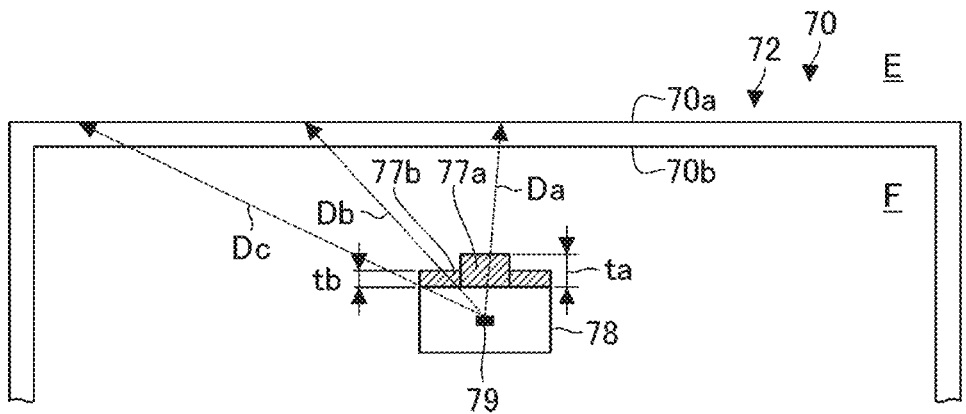
FIG. 3 is a diagram schematically showing a neutron ray scattering member which is provided separately from the enclosure.

FIG. 3 is a diagram schematically showing neutron ray scattering members 77a and 77b which are provided separately from the enclosure 70, and the neutron ray scattering members 77a and 77b are mounted to the device 78 in which the neutron ray source 79 is present, or to the support structure of the device 78. Since the enclosure 70 is not provided with a neutron ray scattering member, the enclosure 70 is configured as the non-accommodation part 72 described above. An incombustible sheet may be attached to the surface of each of the neutron ray scattering members 77a and 77b.

Also in FIG. 3, the neutron ray scattering members 77a and 77b are disposed according to the distance from the neutron ray source 79 to the outer surface 70a of the enclosure 70. The first neutron ray scattering member 77a having a large thickness to is disposed in the first direction (arrow Da) in which the distance from the neutron ray source 79 to the outer surface 70a of the enclosure 70 is the first distance, and is disposed at a position where the neutron ray which is emitted in the first direction from the neutron ray source 79 can be incident. The second neutron ray scattering member 77b having a small thickness tb is disposed in the second direction (arrow Db) in which the distance from the neutron ray source 79 to the outer surface 70a of the enclosure 70 is the second distance larger than the first distance, and is disposed at a position where the neutron ray which is emitted in the second direction from the neutron ray source 79 can be incident. On the other hand, a neutron ray scattering member is not disposed in the third direction (arrow Dc) in which the distance from the neutron ray source 79 to the outer surface 70a of the enclosure 70 is the third distance larger than the first distance and the second distance. The neutron ray scattering members 77a and 77b are disposed in this manner, whereby a reduction effect of the neutron dose rate which is similar to that in the configuration of FIG. 1 is expected.

In FIG. 3, since the neutron ray scattering members 77a and 77b are disposed closer to the neutron ray source 79, the amount of neutron ray scattering members 77a and 77b which are required is smaller than that of the neutron ray scattering members 76a and 76b in FIG. 1. Therefore, the disposition of the neutron ray scattering member in FIG. 3 may be preferable to that in FIG. 1. However, there are various devices, cables, or the like around the device 78 configuring the beamline, and thus it is not always easy to dispose the neutron ray scattering members in the vicinity of the device 78 without any gaps. Therefore, in this embodiment, the neutron ray scattering members 77a and 77b are appropriately disposed also in the vicinity of the main body, as shown in FIG. 3, while being based on the dispositions of the neutron ray scattering members 76a and 76b which are mounted to the enclosure 70, as shown in FIG. 1. In this way, the neutron dose rate in the external space E of the enclosure 70 is equal to or less than the reference value while reducing the total amount of neutron ray scattering members in the entire implanter.

Figure 4:
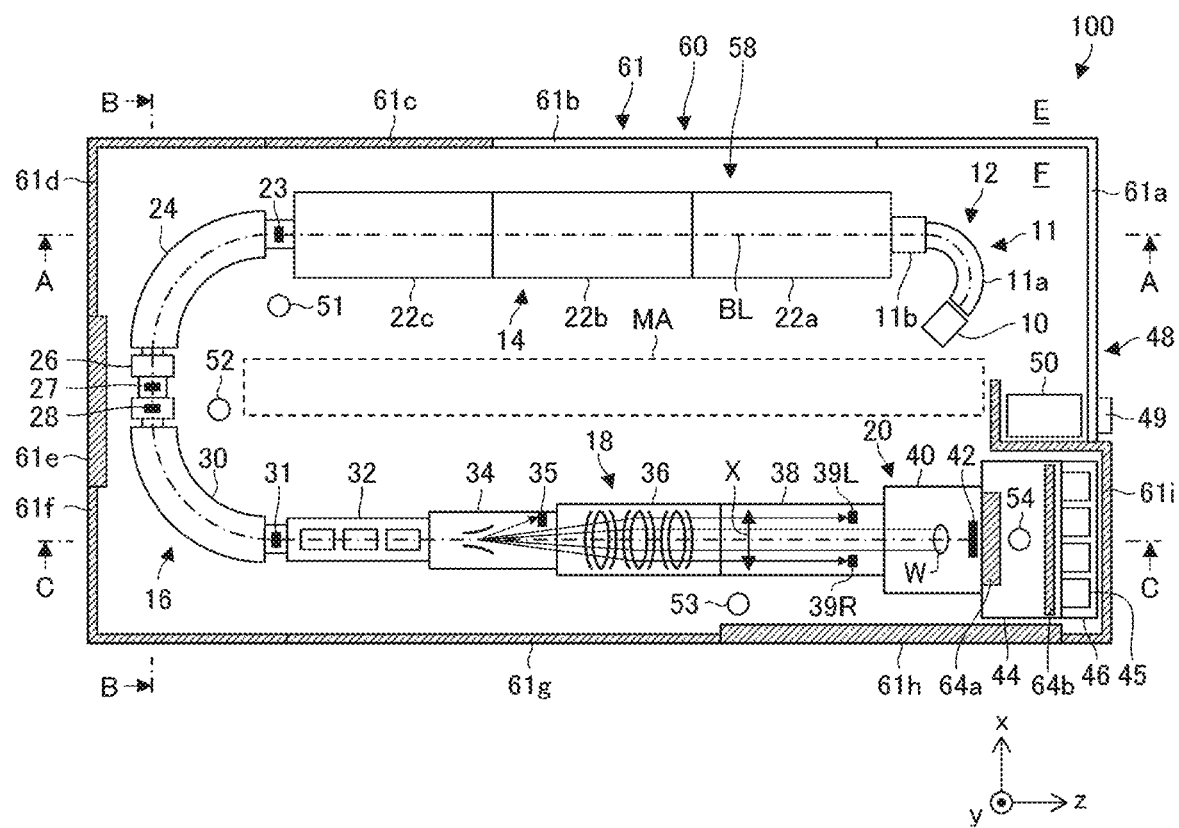
FIG. 4 is a top view showing a schematic configuration of an ion implanter according to an embodiment.
Figure 5A:
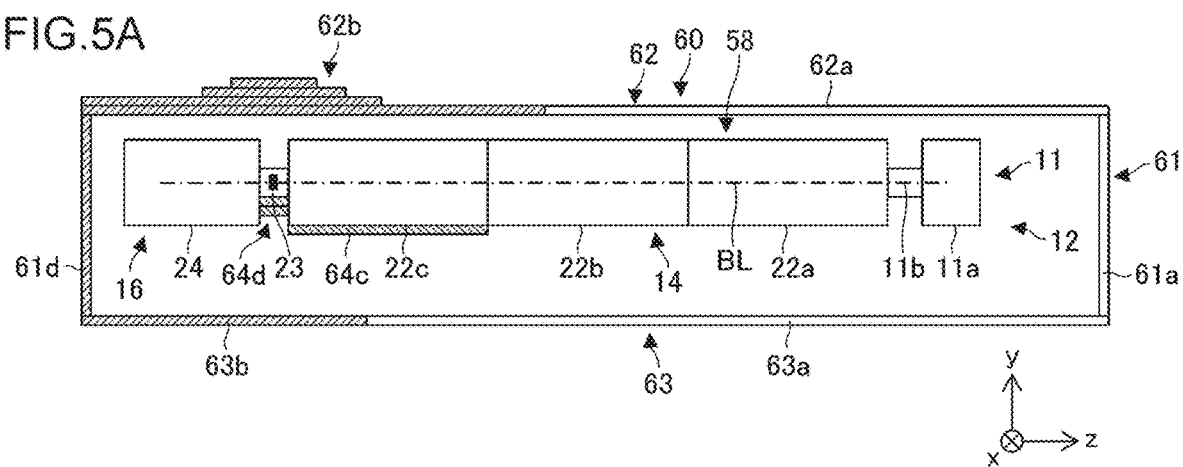
FIGS. 5A to 5C are side views showing a schematic configuration of the ion implanter of FIG. 4.
Figure 5B:
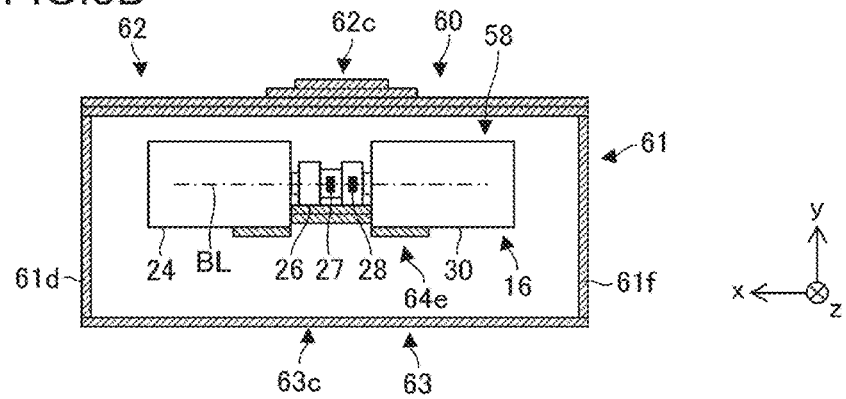
Figure 5C:
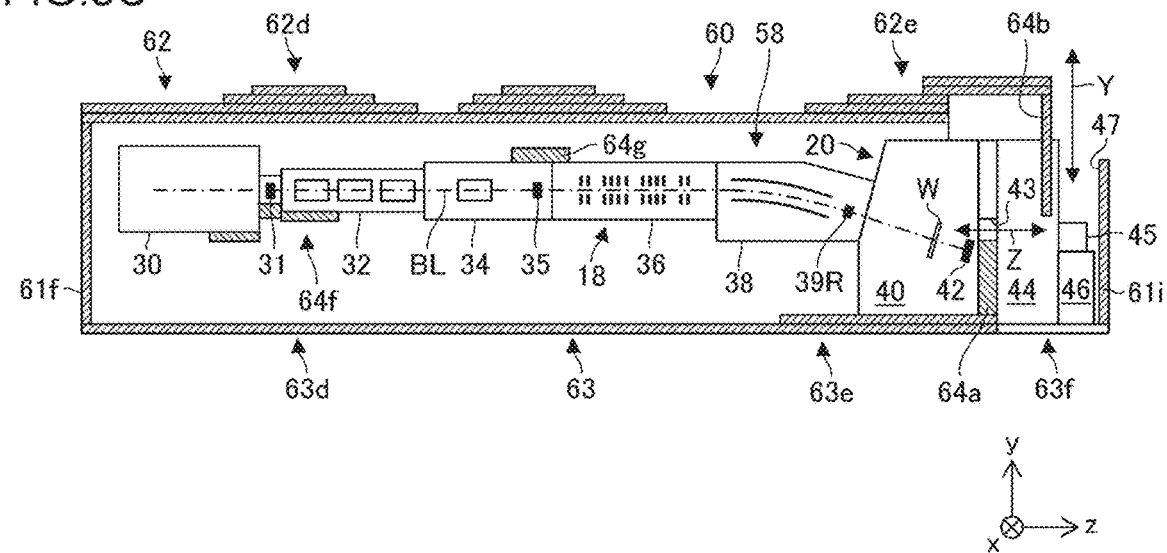

FIG. 4 is a top view schematically showing an ion implanter 100 according to an embodiment. FIGS. 5A to 5C are side views showing a schematic configuration of the ion implanter in FIG. 4. FIG. 5A corresponds to a cross section taken along the line A-A in FIG. 4, FIG. 5B corresponds to a cross section taken along the line B-B in FIG. 4, and FIG. 5C corresponds to a cross section taken along the line C-C in FIG. 4.

The ion implanter 100 includes a main body 58 and an enclosure 60. The main body 58 includes a beam generation unit 12, a beam acceleration unit 14, a beam deflection unit 16, a beam transport unit 18, and a substrate transferring/processing unit 20. The enclosure 60 is disposed on the outer periphery of the main body 58 and at least partially encloses the main body 58. Although details will be described later, the neutron ray scattering members are disposed at hatched portions in the drawing.

The beam generation unit 12 includes an ion source 10 and a mass analyzer 11. In the beam generation unit 12, an ion beam is extracted from the ion source 10, and the extracted ion beam is subjected to mass analysis by the mass analyzer 11. The mass analyzer 11 includes a mass analyzing magnet 11a and a mass analyzing slit 11b. The mass analyzing slit 11b is disposed on the downstream side of the mass analyzing magnet 11a. As a result of the mass analysis by the mass analyzer 11, only ion species necessary for implantation are selected, and the ion beam of the selected ion species is led to the following beam acceleration unit 14.

The beam acceleration unit 14 includes a plurality of linear acceleration units 22a, 22b, and 22c that accelerate the ion beam, and a beam profile slit 23, and configures a linearly extending portion of a beamline BL. Each of the plurality of linear acceleration units 22a to 22c includes one or more radio-frequency resonators and accelerates the ion beam by causing a radio-frequency (RF) electric field to act on the ion beam. The beam profile slit 23 is provided on the farthest downstream side of the beam acceleration unit 14 and is used to measure the beam profile of the ultrahigh energy ion beam accelerated by the plurality of linear acceleration units 22a to 22c.

In this embodiment, three linear acceleration units 22a to 22c are provided. The first linear acceleration unit 22a is provided at an upstream stage of the beam acceleration unit 14 and includes a plurality of (for example, 5 to 10) radio-frequency resonators. The first linear acceleration unit 22a performs "bunching" that fits a continuous beam (DC beam) which exits from the beam generation unit 12 to a specific acceleration phase, and accelerates the ion beam to an energy of about 1 MeV, for example. The second linear acceleration unit 22b is provided at a middle stage of the beam acceleration unit 14, and includes a plurality of (for example, 5 to 10) radio-frequency resonators. The second linear acceleration unit 22b accelerates the ion beam which exits from the first linear acceleration unit 22a to an energy in a range about from 2 to 3 MeV. The third linear acceleration unit 22c is provided at a downstream stage of the beam acceleration unit 14, and includes a plurality of (for example, 5 to 10) radio-frequency resonators. The third linear acceleration unit 22c accelerates the ion beam which exits from the second linear acceleration unit 22b to a ultrahigh energy of 4 MeV or higher.

In this embodiment, about 15 to 30 of radio-frequency resonators which are included in the beam acceleration unit 14 are separately mounted on the three linear acceleration units 22a to 22c. However, the configuration of the beam acceleration unit 14 is not limited to the illustrated configuration. The beam acceleration unit 14 may be configured as a single linear acceleration unit as a whole, or may be configured to be divided into two linear acceleration units or four or more linear acceleration units. Further, the beam acceleration unit 14 may be configured with any other type of acceleration unit, and may include, for example, a tandem acceleration unit. This embodiment is not limited to a specific ion acceleration method, and any beam acceleration unit can be adopted as long as it can generate an ultrahigh energy ion beam of 4 MeV or higher.

The ultrahigh energy ion beam which exits from the beam acceleration unit 14 has a certain range of energy distribution. For this reason, in order to irradiate a wafer with a ultrahigh energy ion beam that is reciprocally scanned and parallelized downstream of the beam acceleration unit 14, it is necessary to carry out high-accuracy energy analysis, trajectory correction, and adjustment of beam convergence and divergence in advance.

The beam deflection unit 16 performs energy analysis, energy dispersion control, and trajectory correction of the ultrahigh energy ion beam which exits from the beam acceleration unit 14. The beam deflection unit 16 configures a portion extending in an arc shape of the beamline BL. The ultrahigh energy ion beam is changed in direction by the beam deflection unit 16 and directed to the beam transport unit 18.

The beam deflection unit 16 includes an energy analyzing electromagnet 24, a laterally focusing quadrupole lens 26 which suppresses energy dispersion, an energy analyzing slit 27, a first Faraday cup 28, and a deflection electromagnet 30 which provides beam steering (trajectory correction), and a second Faraday cup 31. The energy analyzing electromagnet 24 is also called an energy filter electromagnet (EFM). Further, a device group which is composed of the energy analyzing electromagnet 24, the laterally focusing quadrupole lens 26, the energy analyzing slit 27, and the first Faraday cup 28 is collectively referred to as an "energy analyzer".

The energy analyzing slit 27 is configured such that a slit width is variable in order to adjust the resolution of energy analysis. The energy analyzing slit 27 is composed of, for example, two shielding members movable in a slit width direction, and is configured such that the slit width can be adjusted by changing the interval between the two shielding members. The energy analyzing slit 27 may be configured such that the slit width is variable by selecting any one of a plurality of slits having different slit widths.

The first Faraday cup 28 is disposed immediately downstream of the energy analyzing slit 27 and is used for beam current measurement for energy analysis. The second Faraday cup 31 is disposed immediately downstream of the deflection electromagnet 30 and is provided for beam current measurement of the ion beam which is subjected to the trajectory correction and enters the beam transport unit 18. Each of the first Faraday cup 28 and the second Faraday cup 31 is configured to be able to be inserted into and retracted from the beamline BL by the operation of a Faraday cup driving unit (not shown).

The beam transport unit 18 configures a linearly extending portion of the beamline BL and is arranged to be parallel to the beam acceleration unit 14 with a maintenance area MA in the center of the implanter interposed therebetween. The length of the beam transport unit 18 is designed to be approximately the same as the length of the beam acceleration unit 14. As a result, the beamline BL which is composed of the beam acceleration unit 14, the beam deflection unit 16, and the beam transport unit 18 forms a U-shaped layout as a whole.

The beam transport unit 18 includes a beam shaper 32, a beam scanner 34, a beam dump 35, a beam parallelizer 36, a final energy filter 38, and left and right Faraday cups 39L and 39R.

The beam shaper 32 includes a focusing and defocusing device such as a quadrupole focusing and defocusing lens (Q lens), and is configured to shape a profile of the ion beam that has passed through the beam deflection unit 16 into a desired cross-sectional shape. The beam shaper 32 is configured with, for example, an electric field type three-stage quadrupole lens (also referred to as a triplet Q lens), and has three quadrupole lenses. By using three lenses, the beam shaper 32 can independently adjust the convergence or divergence of the ion beam in each of the horizontal direction (x direction) and the vertical direction (y direction). The beam shaper 32 may include a magnetic field type lens, or may include a lens that shapes a beam profile by using both an electric field and a magnetic field.

The beam scanner 34 is a beam deflector which is configured to provide a reciprocal scanning of a beam and performs scanning with the shaped ion beam in the x direction. The beam scanner 34 has a scanning electrode pair facing each other in the beam scanning direction (x direction). The scanning electrode pair is connected to a variable voltage power source (not shown), and by periodically changing a voltage which is applied between the scanning electrode pair, the electric field which is generated between the electrode pair is changed to deflect the ion beam at various angles. As a result, the ion beam performs scanning over a scanning range which is indicated by an arrow X. In FIG. 4, a plurality of trajectories of the ion beam in the scanning range are indicated by thin solid lines.

The beam scanner 34 causes the ion beam to be incident on the beam dump 35 provided at a position away from the beamline BL by deflecting the beam beyond the scanning range indicated by the arrow X. The beam scanner 34 temporarily retracts the ion beam from the beamline BL toward the beam dump 35, thereby blocking the ion beam such that the ion beam does not reach the substrate transferring/processing unit 20 on the downstream side.

The beam parallelizer 36 is configured to make a traveling direction of the scanning ion beam parallel to the trajectory of the designed beamline BL. The beam parallelizer 36 has a plurality of arc-shaped parallelizing lens electrodes each of which has an ion beam passage slit provided at a central portion. The parallelizing lens electrodes are connected to high-voltage power sources (not shown), and cause electric fields which are generated by application of voltages to act on the ion beam, thereby making the traveling directions of the ion beam parallel to each other. The beam parallelizer 36 may be replaced with another beam parallelizing device, and the beam parallelizing device may be configured as a magnet device using a magnetic field.

The final energy filter 38 is configured to analyze the energy of the ion beam and deflect ions having the desired energy downward (to the −y direction) to lead them to the substrate transferring/processing unit 20. The final energy filter 38 is sometimes referred to as an angular energy filter (AEF) and has an AEF electrode pair for deflection by an electric field. The AEF electrode pair is connected to a high-voltage power source (not shown). In FIG. 5C, a positive voltage is applied to the upper AEF electrode, and a negative voltage is applied to the lower AEF electrode, whereby the ion beam is deflected downward. The final energy filter 38 may be configured with a magnetic device for deflection by a magnetic field, or may be configured with a combination of the AEF electrode pair for deflection by the electric field and the magnet device.

The left and right Faraday cups 39L and 39R are provided on the downstream side of the final energy filter 38, and are disposed at positions where the beams can be incident on the Faraday cups at the left and right ends of the scanning range indicated by the arrow X. The left and right Faraday cups 39L and 39R are provided at positions where the Faraday cups do not block the beam which is directed toward the wafer W, and measure a beam current during ion implantation into the wafer W.

The substrate transferring/processing unit 20 is provided on the downstream side of the beam transport unit 18, that is, farthest downstream of the beamline BL. The substrate transferring/processing unit 20 includes an implantation process chamber 40, a beam monitor 42, a substrate transfer device 44, and a load port 46. The implantation process chamber 40 is provided with a platen driving device (not shown) which holds the wafer W during ion implantation and moves the wafer W in a direction (y direction) perpendicular to the beam scanning direction (x direction).

The beam monitor 42 is provided farthest downstream of the beamline BL in the interior of the implantation process chamber 40. The beam monitor 42 is provided at a position where the ion beam can be incident in a case where the wafer W is not present on the beamline BL, and is configured to measure the beam current before or during the ion implantation process. The beam monitor 42 is located, for example, near a transfer port 43 that connects the implantation process chamber 40 and the substrate transfer device 44, and is provided at a position vertically below the transfer port 43.

The substrate transfer device 44 is configured to transfer the wafer W between the load port 46 in which a wafer cassette 45 is placed and the implantation process chamber 40. The load port 46 is configured such that a plurality of the wafer cassettes 45 can be placed therein at the same time, and has, for example, four placing tables arranged in the x direction. A wafer cassette transfer port 47 is provided vertically above the load port 46, and is configured such that the wafer cassette 45 can pass in the vertical direction as indicated by an arrow Y. The wafer cassette 45 is automatically loaded into the load port 46 and automatically unloaded from the load port 46 through the wafer cassette transfer port 47 by, for example, a transfer robot which is installed on a ceiling or the like in a semiconductor manufacturing factory where the ion implanter 100 is installed.

The ion implanter 100 further includes a central control unit 50. The central control unit 50 controls the overall operation of the ion implanter 100. The central control unit 50 is realized by elements and devices such as a CPU and a memory of a computer in terms of hardware, and is realized by a computer program or the like in terms of software. Various functions which are provided by the central control unit 50 can be realized by cooperation of hardware and software.

An operation panel 49 having a display device and an input device for setting the operation mode of the ion implanter 100 is provided in the vicinity of the central control unit 50. The positions of the central control unit 50 and the operation panel 49 are not particularly limited. However, for example, the central control unit 50 and the operation panel 49 can be disposed to be adjacent to a doorway 48 of the maintenance area MA between the beam generation unit 12 and the substrate transferring/processing unit 20. The ion source 10, the load port 46, the central control unit 50, and the operation panel 49, which are frequently operated by a worker who manages the ion implanter 100, are provided to be adjacent to each other, whereby work efficiency can be improved.

The ion implanter 100 has a neutron ray source in which a neutron ray can be generated due to collision of an ion beam having a ultrahigh energy of 4 MeV or more. A member which can serve as the neutron ray source is a member on which an ultrahigh energy ion beam can be continuously incident in a certain process, and is a slit, a beam monitor, a beam dump, or the like. Specifically, as the slit which can serve as the neutron ray source, the beam profile slit 23, the energy analyzing slit 27, or the like can be given as an example. Further, as the beam monitor which can serve as the neutron ray source, the first Faraday cup 28, the second Faraday cup 31, the left and right Faraday cups 39L and 39R, the beam monitor 42, or the like can be given as an example. Further, the beam dump 35 provided downstream of the beam scanner 34 can also serve as the neutron ray source. In FIG. 4 and FIGS. 5A to 5C, the constituent elements of the beamline which can serve as the neutron ray sources are painted in black.

The ion implanter 100 includes a plurality of neutron ray measuring instruments 51, 52, 53, and 54 for monitoring neutron rays which can be generated in the implanter. The dose rate of the neutron ray which can be generated in the ion implanter 100 is not so large and can be a value close to a detection limit of a general neutron ray measuring instrument, and thus, the neutron ray measuring instrument is disposed in the vicinity of the neutron ray source in order to improve measurement accuracy. The first neutron ray measuring instrument 51 is disposed in the vicinity of the beam profile slit 23, and the second neutron ray measuring instrument 52 is disposed in the vicinity of the energy analyzing slit 27 and the first Faraday cup 28. The third neutron ray measuring instrument 53 is disposed in the vicinity of the final energy filter 38 which is located between the beam dump 35 and the left and right Faraday cups 39L and 39R, and the fourth neutron ray measuring instrument 54 is disposed in the vicinity of the beam monitor 42.

The disposition of the neutron ray measuring instruments is only exemplification, and the neutron ray measuring instruments may be disposed in locations, the number of which is smaller or larger than that of the locations shown in the drawing. For example, an additional or alternative neutron ray measuring instrument may be disposed in the vicinity of the second Faraday cup 31 or the beam dump 35. Further, a plurality of neutron ray measuring instruments may be provided at the same location, and for example, each of the neutron ray measuring instruments 51 to 54 which are disposed at the four locations in FIG. 4 may have a plurality of (for example, two or three) neutron ray measuring instruments.

At least apart of the enclosure 60 scatters the neutron rays which are generated in the main body 58 such that the neutron dose rate in the external space E outside of the enclosure 60 is equal to or less than a predetermined reference value. The enclosure 60 includes a side wall portion 61 which is provided on the side of the main body 58, a ceiling portion 62 which is provided vertically above the main body 58, and a floor portion 63 which is provided vertically below the main body 58, as shown in FIGS. 5A to 5C. The enclosure 60 encloses a substantially rectangular parallelepiped internal space F which is occupied by the main body 58.

A neutron ray scattering member is at least partially mounted to each of the side wall portion 61, the ceiling portion 62, and the floor portion 63. On the other hand, a neutron ray scattering member is not mounted to a part of the enclosure 60 which is disposed along a partial section of the beamline, that is, a part of the side wall portion 61, the ceiling portion 62, and the floor portion 63. In the drawing, a neutron ray scattering member is provided in a hatched portion, and a neutron ray scattering member is not provided in a non-hatched portion.

At least a part of each of the side wall portion 61, the ceiling portion 62, and the floor portion 63 can be configured, for example, in the same manner as the accommodation part 71 or the non-accommodation part 72 described above. A slide door or a hinged door can be provided at any position of the enclosure 60, and a neutron ray scattering member may be mounted to the door structure.

The side wall portion 61 has a first side wall portion 61a which is disposed in the vicinity of or around the beam generation unit 12. The beam generation unit 12 is a portion through which a low-energy ion beam passes before being accelerated to ultrahigh energy, and does not serve as a neutron ray source. Further, since the first side wall portion 61a is provided at a position 5 m to 10 m or more away from the neutron ray source, a neutron ray scattering member is not provided therein. For example, the first side wall portion 61a is configured in the same manner as the non-accommodation part 72 described above.

The side wall portion 61 has a second side wall portion 61b and a third side wall portion 61c which are disposed along the beam acceleration unit 14. Since the second side wall portion 61b is disposed along the first linear acceleration unit 22a and the second linear acceleration unit 22b through which the ion beam passes before being accelerated to ultrahigh energy, a neutron ray scattering member is not provided therein. On the other hand, since the third side wall portion 61c is a portion which is disposed along the third linear acceleration unit 22c through which the ultrahigh energy ion beam passes, and is disposed in the vicinity of the beam profile slit 23 which can serve as a neutron ray source, a neutron ray scattering member is provided therein. The second side wall portion 61b is configured, for example, in the same manner as the non-accommodation part 72 described above. The third side wall portion 61c is configured, for example, in the same manner as the accommodation part 71 described above. The third side wall portion 61c may be configured in the same manner as the second accommodation part 71b, and the second neutron ray scattering member 76b having a small thickness may be provided therein.

The side wall portion 61 has a fourth side wall portion 61d, a fifth side wall portion 61e, and a sixth side wall portion 61f which are disposed along the beam deflection unit 16. The beam deflection unit 16 has the energy analyzing slit 27, the first Faraday cup 28, and the second Faraday cup 31 which can serve as neutron ray sources, and thus, neutron ray scattering members are provided in the side wall portions 61d to 61f in the vicinity of the beam deflection unit 16.

Since the fourth side wall portion 61d is disposed in the vicinity of the energy analyzing electromagnet 24 in which the beamline BL has an arc shape, the distance from the beamline BL to the fourth side wall portion 61d is relatively large. For this reason, a neutron ray scattering member having a small thickness is provided in the fourth side wall portion 61d. Similarly, the sixth side wall portion 61f is disposed in the vicinity of the deflection electromagnet 30 in which the beamline BL has an arc shape, and the distance from the beamline BL to the sixth side wall portion 61f is relatively large. Therefore, a neutron ray scattering member having a small thickness is provided therein. The fourth side wall portion 61d and the sixth side wall portion 61f are configured in the same manner as the second accommodation part 71b described above, and the second neutron ray scattering member 76b having a small thickness may be provided therein.

The fifth side wall portion 61e is disposed in the vicinity of the laterally focusing quadrupole lens 26, the energy analyzing slit 27, and the first Faraday cup 28 in which the beamline BL has a linear shape, and is parallel to the beamline BL. The fifth side wall portion 61e is disposed close to the beamline BL from the viewpoint of reducing the occupied area of the enclosure 60. The distance from the energy analyzing slit 27 or the first Faraday cup 28 which serves as a neutron ray source to the fifth side wall portion 61e is small and is, for example, 2 m or less, 1.5 m or less, or 1 m or less. Further, since the neutron ray which is directed from the energy analyzing slit 27 or the first Faraday cup 28 toward the fifth side wall portion 61e travels approximately in the thickness direction of the fifth side wall portion 61e, it is also difficult to increase the effective thickness through which the neutron ray passes. For this reason, a neutron ray scattering member having a large thickness is provided in the fifth side wall portion 61e, and the thickness thereof is, for example, 150 mm or more, 200 mm or more, or 300 mm or more. The fifth side wall portion 61e may be configured in the same manner as the first accommodation part 71a described above, and the first neutron ray scattering member 76a having a large thickness may be provided therein.

The side wall portion 61 has a seventh side wall portion 61g which is disposed along the beam transport unit 18. The seventh side wall portion 61g is disposed in the vicinity of the beam shaper 32, the beam scanner 34, and the beam parallelizer 36 which are located on the upstream side of the beam transport unit 18. Although the second Faraday cup 31 or the beam dump 35 which can serve as a neutron ray sources is present in the vicinity of the seventh side wall portion 61g, the distances from these neutron ray sources to the seventh side wall portion 61g are relatively large. For this reason, a neutron ray scattering member having a small thickness is provided in the seventh side wall portion 61g. The seventh side wall portion 61g may be configured in the same manner as the second accommodation part 71b described above, and the second neutron ray scattering member 76b having a small thickness may be provided therein.

The side wall portion 61 has an eighth side wall portion 61h which is disposed along the final energy filter 38, the implantation process chamber 40, and the substrate transfer device 44. The eighth side wall portion 61h is disposed in the vicinity of the beam monitor 42 on which the ultrahigh energy ion beam can be incident frequently, and the neutron dose rate attributable to the beam monitor 42 is relatively high. Therefore, a neutron ray scattering member having a large thickness is provided therein. The eighth side wall portion 61h may be configured in the same manner as the first accommodation part 71a described above, and the first neutron ray scattering member 76a having a large thickness may be provided therein.

The side wall portion 61 has a ninth side wall portion 61i which is disposed so as to surround the load port 46. The ninth side wall portion 61i has a portion which is disposed in front of the load port 46 and other portions which are disposed on the sides of the load port 46. A doorway to the load port 46 and front doors are provided in the ninth side wall portion 61i. Since the ninth side wall portion 61i is disposed in the vicinity of the beam monitor 42, a neutron ray scattering member is provided therein. Since the distance from the beam monitor 42 toward the ninth side wall portion 61i is short, it is preferable that a neutron ray scattering member having a large thickness is provided in the ninth side wall portion 61i. However, if the thicknesses of the front doors are too large, it takes effort to open and close the front door, leading to a degradation in convenience. Therefore, by disposing additional neutron ray scattering members 64a and 64b between the beam monitor 42 and the load port 46, the thickness of the neutron ray scattering member required for the ninth side wall portion 61i is reduced. The ninth side wall portion 61i may be configured in the same manner as the second accommodation part 71b described above, and the second neutron ray scattering member 76b having a small thickness may be provided therein.

Also with respect to the ceiling portion 62 and the floor portion 63, neutron ray scattering members are provided in the same way as the side wall portion 61. That is, a neutron ray scattering member is disposed mainly in the vicinity of the neutron ray source or at a location where the distance from the neutron ray source to the ceiling portion 62 or the floor portion 63 is short, and at the other locations, the neutron ray scattering member is made thin or a neutron ray scattering member is not provided.

In FIG. 5A, the ceiling portion 62 has a first ceiling portion 62a in which a neutron ray scattering member is not provided, and a second ceiling portion 62b in which a neutron ray scattering member is provided. The first ceiling portion 62a is disposed along the beam generation unit 12 and the upstream side of the beam acceleration unit 14 (the first linear acceleration unit 22a and the second linear acceleration unit 22b). The second ceiling portion 62b is disposed along the downstream side of the beam acceleration unit 14 (the third linear acceleration unit 22c and the beam profile slit 23). Since the second ceiling portion 62b has a short distance from the beam profile slit 23 which can serve as a neutron ray source (for example, within 1 m), the thickness of the neutron ray scattering member is changed stepwise according to the distance from the beam profile slit 23. For example, in the second ceiling portion 62b, the shorter the distance from the beam profile slit 23 becomes, the further the number of stacked plate-shaped neutron ray scattering members is increased.

In FIG. 5A, the floor portion 63 has a first floor portion 63a in which a neutron ray scattering member is not provided, and a second floor portion 63b in which a neutron ray scattering member is provided. The first floor portion 63a is disposed along the beam generation unit 12 and the upstream side of the beam acceleration unit 14. The second floor portion 63b is disposed in the vicinity of the beam profile slit 23. From the viewpoint of securing a foothold at the time of mounting or maintenance work of the main body 58, it is preferable that the floor portion 63 is configured to be as flat as possible. In other words, it is not preferable that the upper surface of the floor portion 63 is configured in a step shape due to partially disposing a thick neutron ray scattering member on the floor portion 63. Therefore, additional neutron ray scattering members 64c and 64d are disposed on the lower surface of the third linear acceleration unit 22c or a chamber accommodating the beam profile slit 23, and thus the thickness of the neutron ray scattering member required for the second floor portion 63b is reduced.

In FIG. 5B, the ceiling portion 62 has a third ceiling portion 62c in which a neutron ray scattering member is provided. The third ceiling portion 62c is disposed along the beam deflection unit 16. The third ceiling portion 62c is configured such that in the vicinity of the energy analyzing slit 27 or the first Faraday cup 28 which can serve as a neutron ray source, the shorter the distance from the neutron ray source becomes, the larger the thickness of the neutron ray scattering member becomes, in the same way as the second ceiling portion 62b.

In FIG. 5B, the floor portion 63 has a third floor portion 63c in which a neutron ray scattering member is provided. The third floor portion 63c is disposed along the beam deflection unit 16. Further, an additional neutron ray scattering member 64e is disposed on the lower surface of the device configuring the beam deflection unit 16. The additional neutron ray scattering member 64e is disposed in the vicinity of the energy analyzing slit 27 or the first Faraday cup 28 which can serve as a neutron ray source, and is configured such that the shorter the distance from the neutron ray source becomes, the larger the thickness of the neutron ray scattering member becomes. By disposing the additional neutron ray scattering member 64e, the thickness of the neutron ray scattering member required for the third floor portion 63c is reduced.

In FIG. 5C, the ceiling portion 62 has a fourth ceiling portion 62d and a fifth ceiling portion 62e in which neutron ray scattering members are provided. The fourth ceiling portion 62d is disposed along the beam transport unit 18, and the fifth ceiling portion 62e is disposed along the substrate transferring/processing unit 20. The fourth ceiling portion 62d is configured such that the thickness of the neutron ray scattering member increases in the vicinity of each of the second Faraday cup 31 and the beam dump 35 which can serve as neutron ray sources. Further, an additional neutron ray scattering member 64g is provided in the vicinity of the beam dump 35 above the beam scanner 34. The fifth ceiling portion 62e is configured such that the shorter the distance from the beam monitor 42 which can serve as a neutron ray source becomes, the larger the thickness of the neutron ray scattering member becomes.

In FIG. 5C, the floor portion 63 has a fourth floor portion 63d and a fifth floor portion 63e in which neutron ray scattering members are provided. The fourth floor portion 63d is disposed along the beam transport unit 18, and the fifth floor portion 63e is disposed along the substrate transferring/processing unit 20. The fourth floor portion 63d is configured such that the thickness of the neutron ray scattering member is uniform. An additional neutron ray scattering member 64f is disposed on the lower surface of the main body 58 in the vicinity of the second Faraday cup 31. By disposing the additional neutron ray scattering member 64f, the thickness of the neutron ray scattering member required for the fourth floor portion 63d is reduced. The fifth floor portion 63e is configured such that the thickness of the neutron ray scattering member is increased in the vicinity of the implantation process chamber 40 in which the beam monitor 42 is provided. A neutron ray scattering member is not provided in a floor portion (a sixth floor portion) 63f for the substrate transfer device 44 and the load port 46. This is because the neutron dose rate of the neutron ray which is directed from the beam monitor 42 toward the sixth floor portion 63f can be sufficiently reduced due to the additional neutron ray scattering member 64a which is disposed between the implantation process chamber 40 and the substrate transfer device 44.

In FIG. 5C, the additional neutron ray scattering members 64a and 64b which are provided in the substrate transferring/processing unit 20 are disposed so as not to interfere with the transfer of the wafer W between the implantation process chamber 40 and the load port 46. Specifically, a configuration is made such that a neutron ray scattering member is not disposed on a horizontal wafer transfer path indicated by an arrow Z at the height position where the transfer port 43 is provided. That is, the additional neutron ray scattering members 64a and 64b are disposed so as not to overlap each other in the horizontal direction. On the other hand, in order to prevent the neutron ray from leaking to the outside through the horizontal wafer transfer path indicated by the arrow Z, the ninth side wall portion 61i which includes a neutron ray scattering member is provided in front of the load port 46. The ninth side wall portion 61i is disposed so as to partially overlap each of the additional neutron ray scattering members 64a and 64b in the horizontal direction.

In FIG. 5C, the additional neutron ray scattering member 64b which is provided in the substrate transferring/processing unit 20 is disposed so as not to interfere with the transfer of the wafer cassette indicated by the arrow Y in the vertical direction through the wafer cassette transfer port 47. That is, the additional neutron ray scattering member 64b is disposed away from the ninth side wall portion 61i in the horizontal direction with the wafer cassette transfer port 47 interposed therebetween. On the other hand, in order to prevent the neutron ray from leaking to the outside through the wafer cassette transfer port 47, the additional neutron ray scattering member 64b and the ninth side wall portion 61i are disposed so as to partially overlap each other in the horizontal direction.

Figure 6:
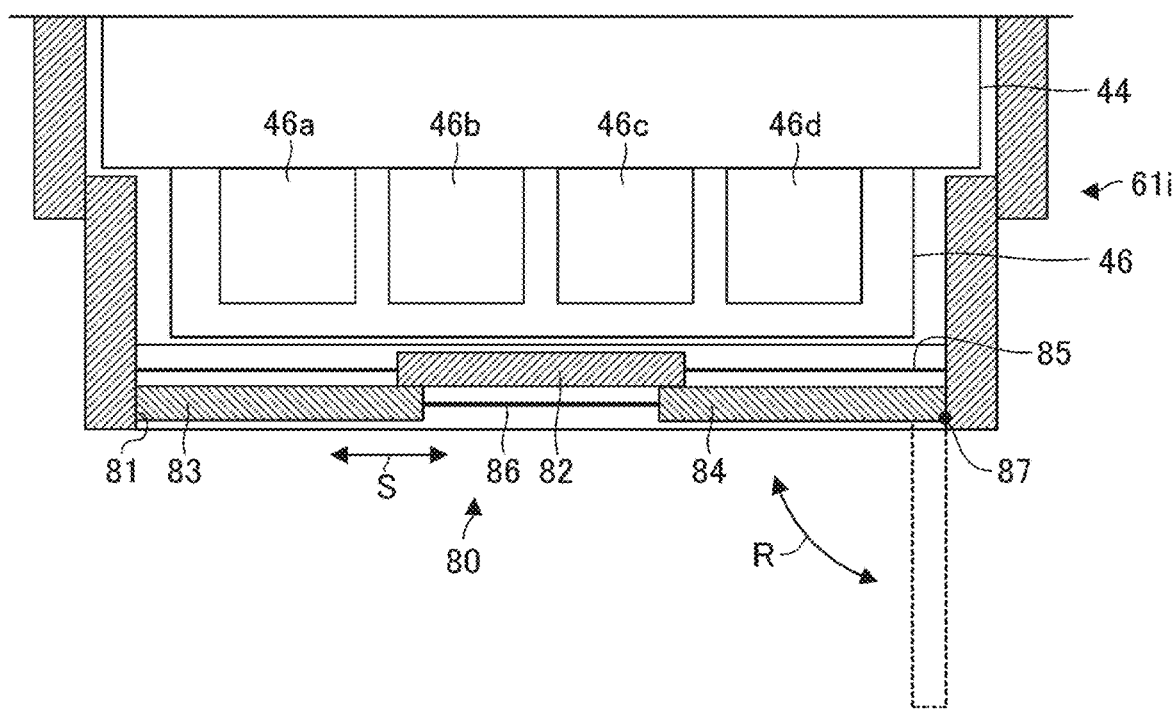
FIG. 6 is a top view schematically showing a structure of a front door of a load port.

FIG. 6 is a top view schematically showing the structure of a front door 80 in front of the load port 46. The load port 46 has four placing tables 46a to 46d which are arranged in a line in the left-right direction (the direction of an arrow S). A doorway 81 surrounded by a part of the ninth side wall portion 61i of FIG. 4 is provided in front of the load port 46, and two slide doors 82 and 83 and one hinged door 84 are provided so as to be able to open and close the doorway 81. A neutron ray scattering member is mounted to each of the doors 82 to 84 configuring the front door 80.

The first slide door 82 is configured to be slidable in the left-right direction along a first rail 85 extending in the left-right direction, and the second slide door 83 is configured to be slidable in the left-right direction along a second rail 86 extending in the left-right direction. The first slide door 82 and the second slide door 83 are disposed at different positions in a depth direction, and the first slide door 82 is disposed on the far side and the second slide door 83 is disposed on the near side in the front view of the load port 46. The hinged door 84 is configured to be rotatable as indicated by an arrow R with a hinge 87 provided at the right end of the doorway 81 as a rotary shaft.

In the closed state of the front door 80 shown in FIG. 6, the first slide door 82 is disposed at the center of the doorway 81, the second slide door 83 is disposed on the left side of the doorway 81, and the hinged door 84 is disposed on the right side of the doorway 81. In other words, the hinged door 84 closes the right end of the doorway 81, and the two slide doors 82 and 83 close the remaining region of the doorway 81 which is not closed by the hinged door 84. In the closed state, the first slide door 82 and the second slide door 83 are configured to partially overlap each other in the depth direction, and the first slide door 82 and the hinged door 84 are also configured to partially overlap each other in the depth direction. The hinged door 84 is configured such that the position thereof in the depth direction corresponds to that of the second slide door 83 in the closed state.

Figure 7A:
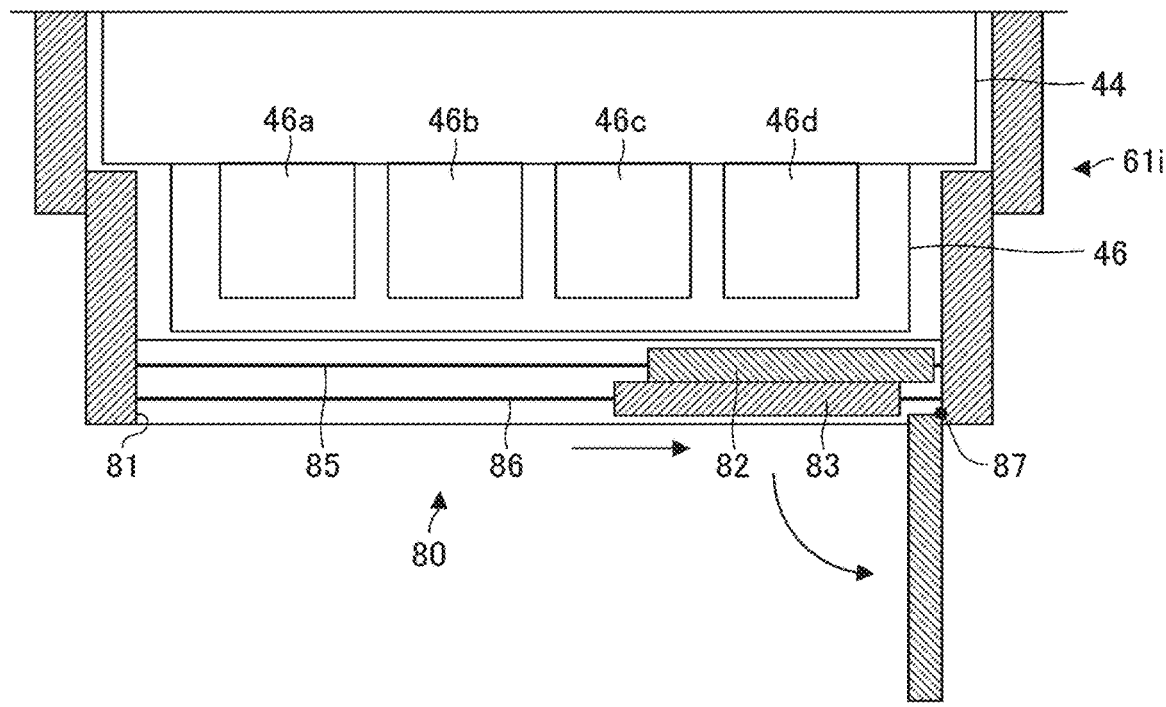
FIGS. 7A and 7B are top views schematically showing the front door in the open states of the load port.
Figure 7B:
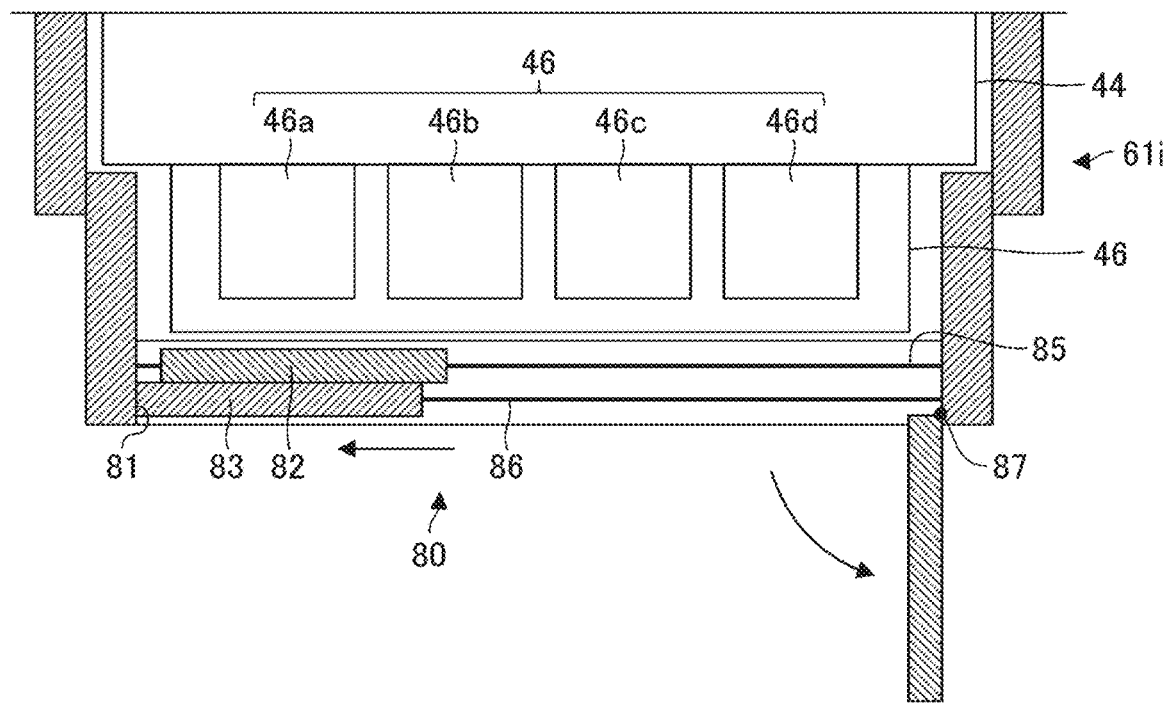

FIGS. 7A and 7B are top views schematically showing the front door 80 in the open state. FIG. 7A shows a state where the left side of the doorway 81 is opened. The hinged door 84 has been opened toward the near side, and the first slide door 82 and the second slide door 83 have been slid to the right side of the doorway 81. As a result, a state is created where the front sides of both the first placing table 46a and the second placing table 46b disposed on the left side are opened. FIG. 7B shows a state where the right side of the doorway 81 is opened. The hinged door 84 has been opened toward the near side, and the first slide door 82 and the second slide door 83 have been slid to the left side of the doorway 81. As a result, a state is created where the front sides of both the third placing table 46c and the fourth placing table 46d disposed on the right side are opened.

According to this embodiment, in the load port 46 provided with the four placing tables 46a to 46d, the entire front of the two placing tables on either of the left side or the right side can be opened in the open state by combining the three doors 82 to 84, and a working space with a margin in the left-right direction can be provided. In a case where the front door 80 is composed of only two slide doors, since the two slide doors are disposed so as to overlap each other in the vicinity of the center of the doorway 81, the front sides of the two central placing tables 46b and 46c cannot be opened widely. Further, in a case where the front door 80 is composed of three slide doors, the three slide doors need to be disposed to be shifted from each other in the depth direction, and thus the thickness of the entire front door 80 in the depth direction is increased. In this embodiment, a neutron ray scattering member having a large thickness (for example, about 200 mm) is mounted to each of the doors 82 to 84 configuring the front door 80, and thus, in a case where three slide doors are adopted, the depth of the front door 80 is increased. On the other hand, according to this embodiment, by combining two slide doors and one hinged door, the doorway 81 can be widely opened while the depth of the front door 80 is reduced.

In the front door 80 shown in FIG. 6 and FIGS. 7A and 7B, a configuration is made in which the hinged door 84 is provided on the right side of the doorway 81. However, the hinged door 84 may be provided on the left side of the doorway 81. That is, the front door 80 may be configured so as to be symmetric in the left-right direction with respect to the illustrated structure. In addition, a configuration may be made such that a first hinged door is disposed on the left side of the doorway 81, a second hinged door is disposed on the right side of the doorway 81, and one slide door is disposed at the center of the doorway 81.

Next, the measurement of the neutron ray will be described. The central control unit 50 acquires the measurement value in each of the plurality of neutron ray measuring instruments 51 to 54 shown in FIG. 4 and monitors the generation status of the neutron rays. The central control unit 50 estimates the position at least one of the neutron ray sources, based on the measurement values in the plurality of neutron ray measuring instruments 51 to 54, and estimates the intensity of the neutron ray which is emitted from at least one of the neutron ray sources whose position is estimated.

For example, in a case where a neutron ray is detected in the first neutron ray measuring instrument 51 or the second neutron ray measuring instrument 52 and a neutron ray is not detected in the third neutron ray measuring instrument 53 and the fourth neutron ray measuring instrument 54, it is estimated that there is a neutron ray source on the upstream side of the beamline BL. In this case, by analyzing the magnitude of the measurement value in each of the first neutron ray measuring instrument 51 and the second neutron ray measuring instrument 52, it is possible to estimate the neutron ray source in which the neutron ray is being generated. For example, in a case where the measurement value in the first neutron ray measuring instrument 51 is large and the measurement value in the second neutron ray measuring instrument 52 is small, it is estimated that the beam profile slit 23 is a neutron ray source. Further, in a case where the measurement value in the first neutron ray measuring instrument 51 is small and the measurement value in the second neutron ray measuring instrument 52 is large, it is estimated that at least one of the energy analyzing slit 27, the first Faraday cup 28, and the second Faraday cup 31 is a neutron ray source. Further, in a case where both the measurement value in the first neutron ray measuring instrument 51 and the measurement value in the second neutron ray measuring instrument 52 are large, it is estimated that there is a possibility that all of the beam profile slit 23, the energy analyzing slit 27, the first Faraday cup 28, and the second Faraday cup 31 may be neutron ray sources. Conversely, in a case where neutron rays are not detected in the first neutron ray measuring instrument 51 and the second neutron ray measuring instrument 52 and a neutron ray is detected in the third neutron ray measuring instrument 53 or the fourth neutron ray measuring instrument 54, it is estimated that there is a neutron ray source on the downstream side of the beamline BL. By estimating the position of the neutron ray source, it is also possible to estimate the intensity of the neutron ray which is emitted from the neutron ray source whose position is estimated, based on the dispositions and distances of the plurality of neutron ray measuring instruments 51 to 54 with respect to the neutron ray source whose position is estimated.

The central control unit 50 may estimate the dose rate distribution of the neutron rays in the internal space F inside of the enclosure 60, based on the measurement values in the plurality of neutron ray measuring instruments 51 to 54. The central control unit 50 may estimate the neutron dose rate outside of the enclosure 60, based on the measurement values in the plurality of neutron ray measuring instruments 51 to 54. The central control unit 50 may estimate, for example, the position and the neutron dose rate of the neutron ray source, and calculate the neutron dose rate at any position in the external space E or the internal space F of the enclosure 60 by simulation or the like, based on the estimated position and the estimated neutron dose rate of the neutron ray source. The neutron dose rate inside or outside of the enclosure 60 may be calculated in consideration of the disposition of the main body 58, the disposition of the enclosure 60, the disposition of the neutron ray scattering member which is provided in the enclosure 60, and the disposition of the neutron ray scattering member which is provided separately from the enclosure 60. In a case where the calculated neutron dose rate inside or outside of the enclosure 60 exceeds a predetermined upper limit value, the central control unit 50 may output an alert, temporarily stop the transport of the ion beam, or change an operation condition of at least one of a plurality of devices configuring the main body 58 such that the neutron dose rate becomes less than the upper limit value.

The central control unit 50 may monitor at least one of the plurality of devices which are disposed along the beamline BL, based on the measurement values in the plurality of neutron ray measuring instruments 51 to 54. Specifically, abnormality of at least one of the plurality of devices configuring the main body 58 may be detected, or a device that needs maintenance may be estimated among the plurality of devices. The central control unit 50 may determine whether at least one device to be monitored is normal or abnormal, by using information on the operation mode of the main body 58. This is because a location serving as a neutron ray source or a neutron dose rate which is generated in the neutron ray source can be different according to the operation mode of the main body 58. Hereinafter, operation modes causing situations where neutron rays can be generated will be described with reference to FIGS. 8 to 14.

Figure 8:
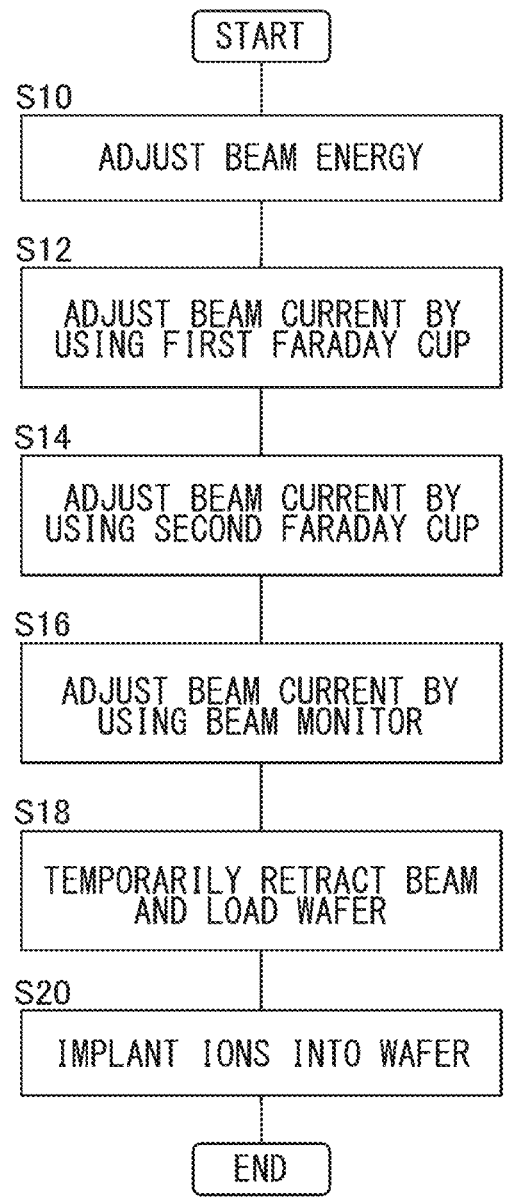
FIG. 8 is a flowchart showing a flow of an ion implantation process according to the embodiment.

FIG. 8 is a flowchart showing a flow of an ion implantation process according to an embodiment, and shows a flow of ion implantation into the wafer W after adjustment of the ion beam. FIGS. 9 to 14 schematically show the operation modes of the main body 58, the positions of the neutron ray sources, and neutron rays 90 to 97 which are detected by the plurality of neutron ray measuring instruments 51 to 54 in each process. In FIGS. 9 to 14, the reaching ranges of the ion beams passing through the beamline BL are indicated by thick lines, and main neutron ray sources are painted in black.

Figure 9:
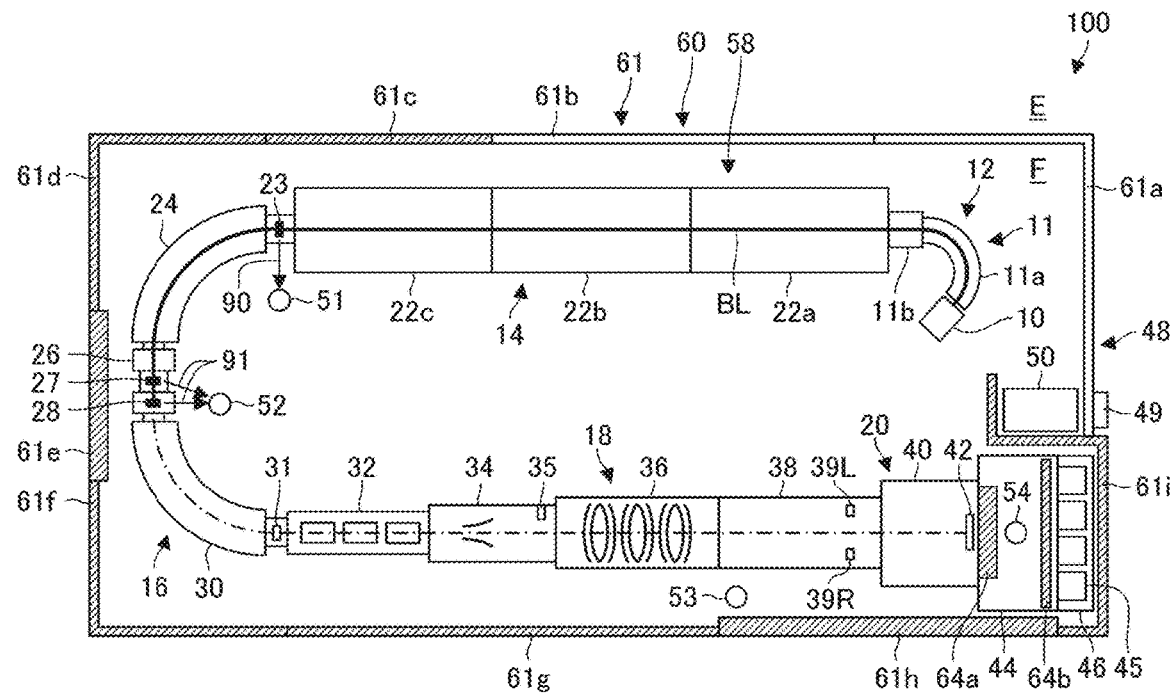
FIG. 9 is a diagram schematically showing the ion implanter in a first process.

First, in a first process (S10) of FIG. 8, the beam energy is adjusted. FIG. 9 schematically shows the ion implanter 100 in the first process. The first process is performed in a state where the beam profile slit 23 is inserted into the beamline BL, the slit width of the energy analyzing slit 27 is narrowed, and the first Faraday cup 28 is inserted into the beamline BL (this state is also referred to as a first operation mode). In the first process, there is a possibility that a ultrahigh energy ion beam may collide with the beam profile slit 23, the energy analyzing slit 27, and the first Faraday cup 28 to generate neutron rays. Therefore, in the first process, the beam profile slit 23, the energy analyzing slit 27, and the first Faraday cup 28 can serve as neutron ray sources. In the first process, the neutron ray 90 which is generated in the beam profile slit 23 is detected mainly by the first neutron ray measuring instrument 51. Further, the neutron ray 91 which is generated in the energy analyzing slit 27 or the first Faraday cup 28 is detected mainly by the second neutron ray measuring instrument 52. The neutron ray 90 which is generated in the beam profile slit 23 can also be detected by the second neutron ray measuring instrument 52. Similarly, the neutron ray 91 which is generated in the energy analyzing slit 27 or the first Faraday cup 28 can also be detected by the first neutron ray measuring instrument 51.

Figure 10:
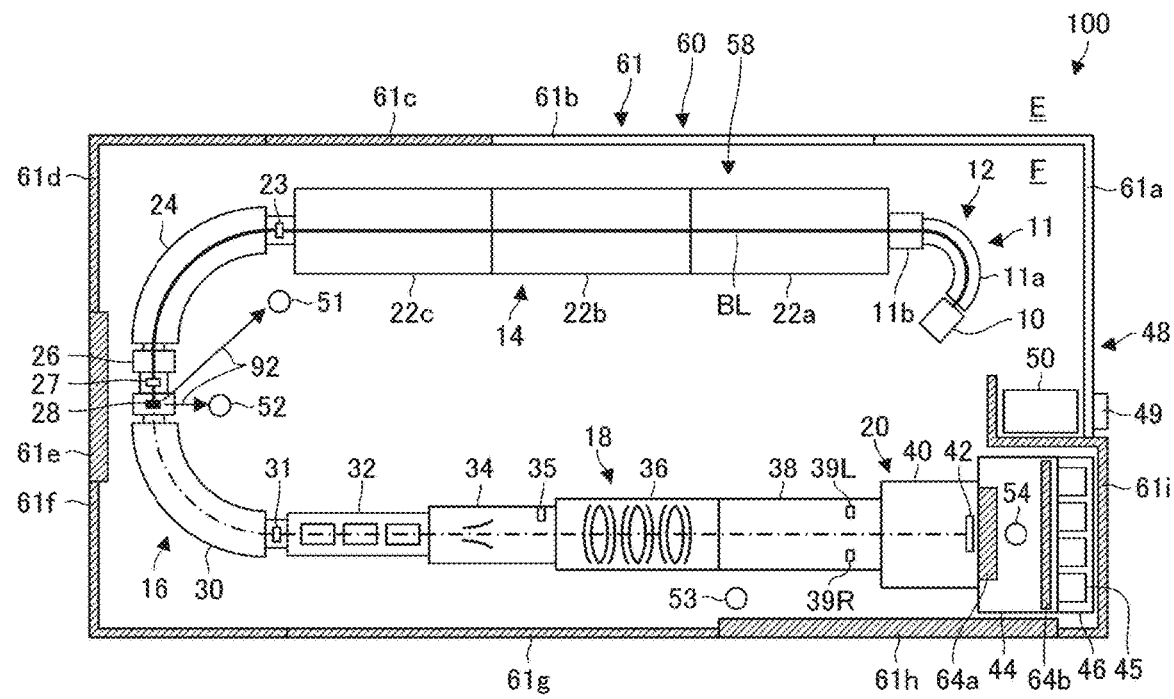
FIG. 10 is a diagram schematically showing the ion implanter in a second process.

Subsequently, in a second process (S12) of FIG. 8, the beam current is adjusted by using the first Faraday cup 28. FIG. 10 schematically shows the ion implanter 100 in the second process. The second process is performed in a state where the beam profile slit 23 is retracted from the beamline BL, the slit width of the energy analyzing slit 27 is increased to the normal width, and the first Faraday cup 28 is inserted into the beamline BL (this state is also referred to as a second operation mode). The second process is an operation mode similar to the first process in FIG. 9. However, the ultrahigh energy ion beam does not collide with the beam profile slit 23 and the ultrahigh energy ion beam hardly collides with the energy analyzing slit 27. As a result, in the second process, the ultrahigh energy ion beam substantially collides with only the first Faraday cup 28, and thus the first Faraday cup 28 can serve as a neutron ray source. The neutron ray 92 which is generated in the first Faraday cup 28 can be detected by the first neutron ray measuring instrument 51 or the second neutron ray measuring instrument 52. In the second process, more ultrahigh energy ion beams are incident on the first Faraday cup 28, and thus, the dose rate of the neutron ray 92 which can be generated in the first Faraday cup 28 is higher than in the first process.

Figure 11:
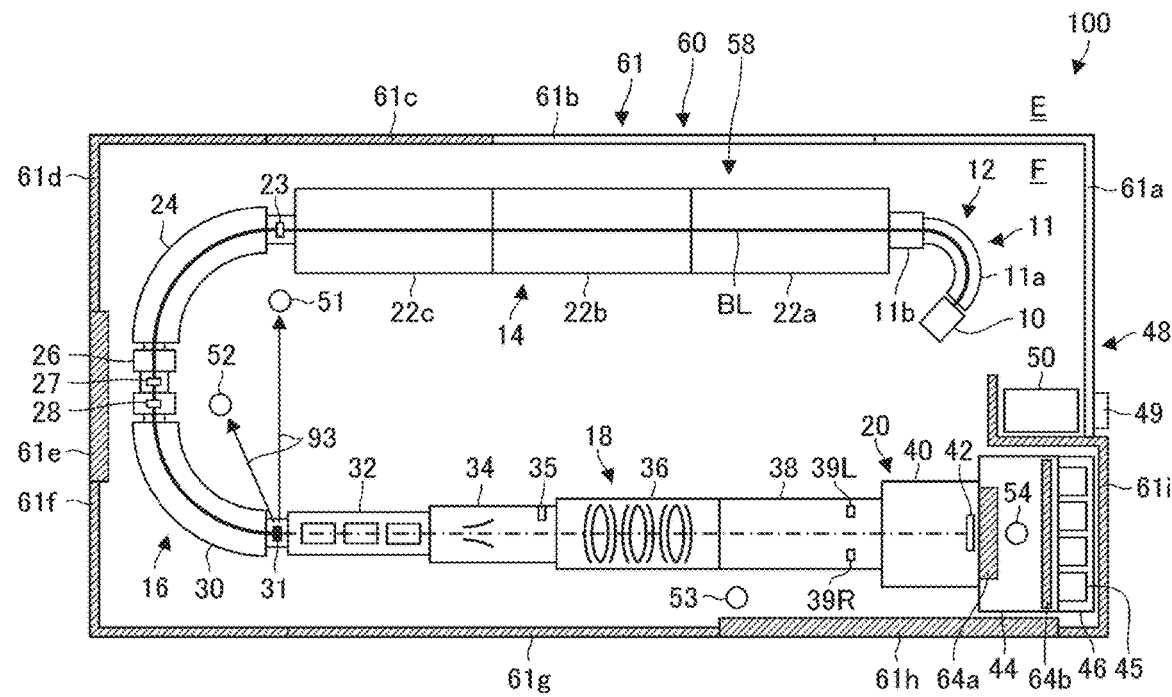
FIG. 11 is a diagram schematically showing the ion implanter in a third process.

Next, in a third process (S14) of FIG. 8, the beam current is adjusted by using the second Faraday cup 31. FIG. 11 schematically shows the ion implanter 100 in the third process. The third process is performed in a state where the first Faraday cup 28 is retracted from the beamline BL and the second Faraday cup 31 is inserted into the beamline BL (this state is also referred to as a third operation mode). In the third process, since the ion beam collides with the second Faraday cup 31, the second Faraday cup 31 can serve as a main neutron ray source. The neutron ray 93 which is generated in the second Faraday cup 31 is detected mainly by the first neutron ray measuring instrument 51 and the second neutron ray measuring instrument 52. In the third processes, the dose rate of the neutron ray 93 which is detected by the second neutron ray measuring instrument 52 disposed in the vicinity of the second Faraday cup 31 is relatively large, and the dose rate of the neutron ray 93 which is detected by the first neutron ray measuring instrument 51 disposed away from the second Faraday cup 31 is relatively small.

Figure 12:
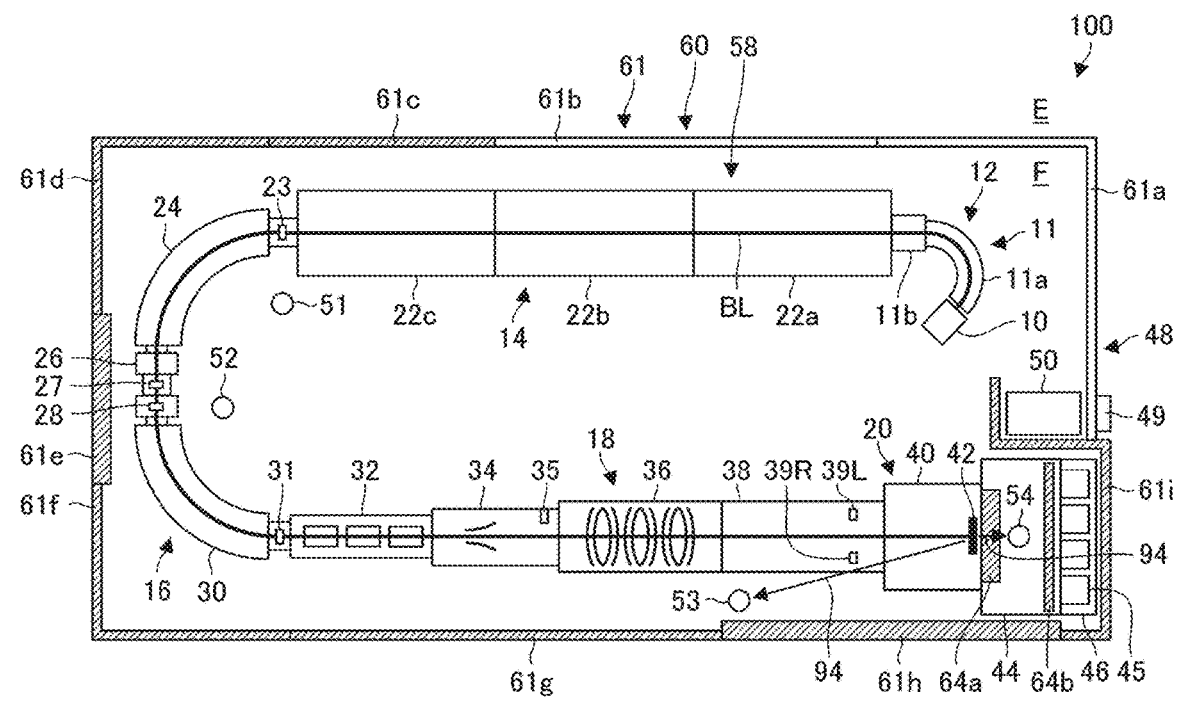
FIG. 12 is a diagram schematically showing the ion implanter in a fourth process.

Next, in a fourth process (S16) of FIG. 8, the beam current is adjusted by using the beam monitor 42. FIG. 12 schematically shows the ion implanter 100 in the fourth process. The fourth process is performed in an un-scanning state where the second Faraday cup 31 is retracted from the beamline BL and reciprocating scanning of the ion beam is not performed by the beam scanner 34 (this state is also referred to as a fourth operation mode). In the fourth process, since the ion beam collides with the beam monitor 42, the beam monitor 42 can serve as a main neutron ray source. The neutron ray 94 which is generated in the beam monitor 42 is detected mainly by the third neutron ray measuring instrument 53 and the fourth neutron ray measuring instrument 54. In the fourth process, the dose rate of the neutron ray 94 which is detected by the fourth neutron ray measuring instrument 54 disposed in the vicinity of the beam monitor 42 is relatively large, and the dose rate of the neutron ray 94 which is detected by the third neutron ray measuring instrument 53 disposed away from the beam monitor 42 is relatively small.

Figure 13:
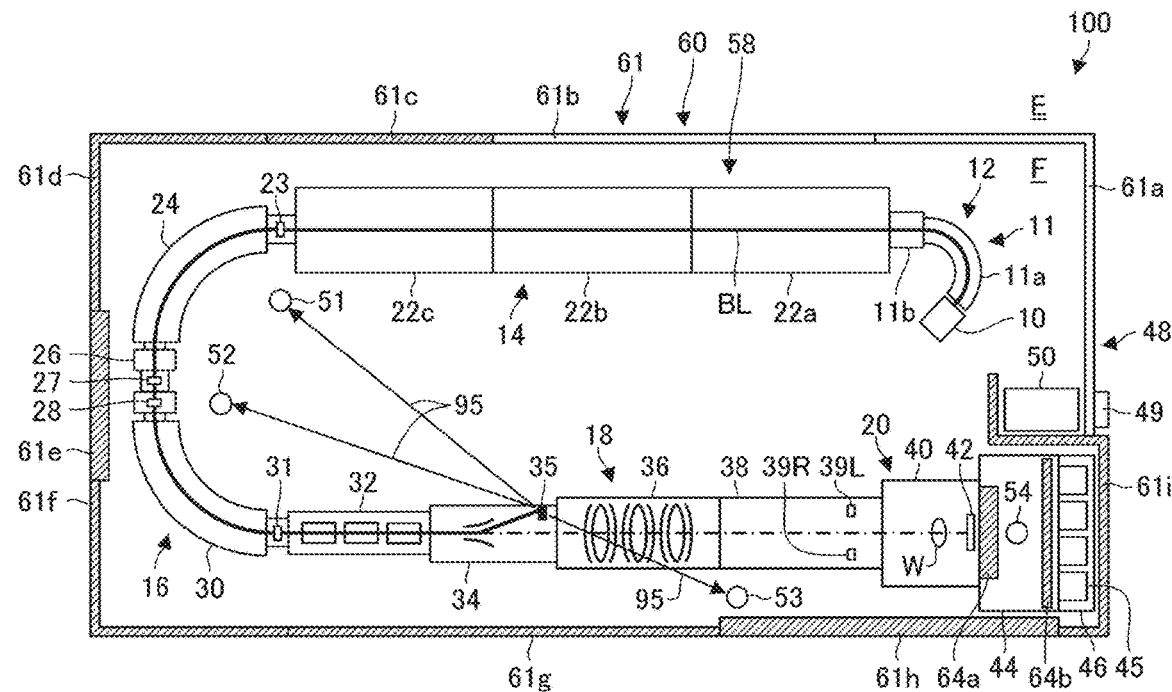
FIG. 13 is a diagram schematically showing the ion implanter in a fifth process.

Next, in a fifth process (S18) of FIG. 8, the ion beam is temporarily retracted from the beamline BL and the wafer W into which the ion is to be implanted is loaded into the implantation process chamber 40. FIG. 13 schematically shows the ion implanter 100 in the fifth process. In the fifth process, the ion beam is deflected by using the beam scanner 34, so that a state where the ion beam is incident on the beam dump 35 is created (this state is also referred to as a fifth operation mode). Therefore, in the fifth process, the beam dump 35 can serve as a main neutron ray source. The neutron ray 95 which is generated in the beam dump 35 is detected mainly by the first neutron ray measuring instrument 51, the second neutron ray measuring instrument 52, and the third neutron ray measuring instrument 53. In the fifth process, the dose rate of the neutron ray 95 which is detected by the third neutron ray measuring instrument 53 disposed in the vicinity of the beam dump 35 is relatively large, and the dose rate of the neutron ray 95 which is detected by the first neutron ray measuring instrument 51 or the second neutron ray measuring instrument 52 disposed away from the beam dump 35 is relatively small.

Figure 14:
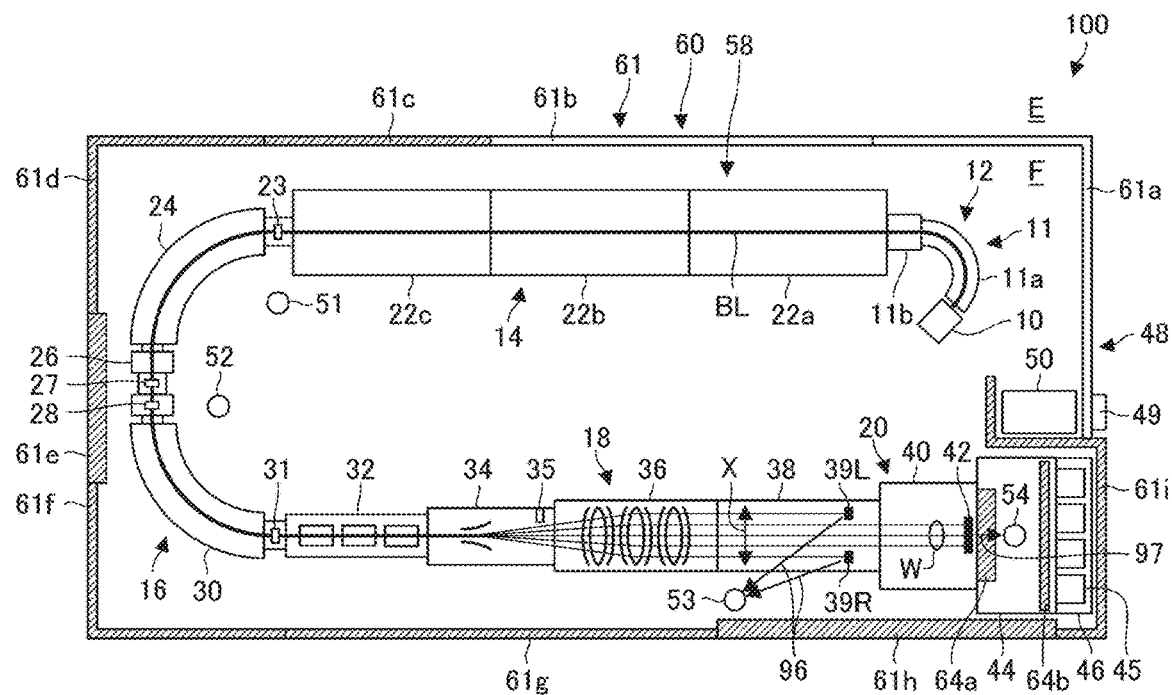
FIG. 14 is a diagram schematically showing the ion implanter in a sixth process.

Next, in a sixth process (S20) of FIG. 8, an ion implantation process is performed by irradiating the wafer W with the ion beam which is reciprocatingly scanned by using the beam scanner 34. FIG. 14 schematically shows the ion implanter 100 in the sixth process. In the sixth process, a state is created where the reciprocating scanning of the ion beam is performed by using the beam scanner 34, so that the ion beam is incident on the left and right Faraday cups 39L and 39R. Further, in the sixth process, a state where the wafer W is mechanically reciprocated in the vertical direction is set, so that at least a part of the ion beam which is not incident on the wafer W is incident on the beam monitor 42 (this state is also referred to as a sixth operation mode). Therefore, in the sixth process, the left and right Faraday cups 39L and 39R and the beam monitor 42 can serve as main neutron ray sources. The neutron rays 96 which are generated in the left and right Faraday cups 39L and 39R are detected mainly by the third neutron ray measuring instrument 53, and the neutron ray 97 which is generated in the beam monitor 42 is detected mainly by the fourth neutron ray measuring instrument 54. In the sixth process, since a part of the ion beam which reaches the implantation process chamber 40 is incident on the beam monitor 42, the neutron dose rate which can be generated in the beam monitor 42 is lower than that in the fourth process and thus the dose rate of the neutron ray 97 which is detected by the fourth neutron ray measuring instrument 54 also becomes low.

The main body 58 can take various operation modes according to the state of the main body 58, in addition to the operation mode corresponding to each of the first to sixth processes.

In this manner, if the operation mode of the main body 58 is changed, a location which can serve as a neutron ray source and a neutron dose rate which is generated in the neutron ray source can also change. Therefore, the central control unit 50 performs abnormality detection corresponding to the operation mode of the main body 58. The central control unit 50 monitors the apparatus, based on information on the operation mode of the main body 58 and the measurement value in at least one neutron ray measuring instrument in a specific operation mode. For example, the criterion of the abnormality detection may be changed according to the operation mode, and at least one of the plurality of devices may be monitored by using the criterion corresponding to the operation mode. Further, in a case where the measurement value in at least one neutron ray measuring instrument exceeds a reference value which is determined corresponding to a specific operation mode, the operation condition of at least one of the plurality of devices may be changed such that the measurement value becomes equal to or less than the reference value. For example, the operation condition may be changed such that the neutron dose rate decreases, or the beam transport may be temporarily stopped such that a neutron ray is not generated.

In the case of the first operation mode in FIG. 9 or the second operation mode in FIG. 10, it can be said that a state is normal where while there is a possibility that the neutron rays 90, 91, and 92 may be detected by the first neutron ray measuring instrument 51 or the second neutron ray measuring instrument 52, a neutron ray is not detected by the third neutron ray measuring instrument 53 and the fourth neutron ray measuring instrument 54. Therefore, in the first operation mode or the second operation mode, the upper limit values of the first neutron ray measuring instrument 51 and the second neutron ray measuring instrument 52 are set to be relatively high, and the upper limit values of the third neutron ray measuring instrument 53 and the fourth neutron ray measuring instrument 54 are set to be relatively low (for example, close to a background noise level). In this way, in a case where a neutron ray is detected by the third neutron ray measuring instrument 53 or the fourth neutron ray measuring instrument 54, it can be detected that some abnormality has occurred in the ion implanter 100. The adjustment of the beam energy or the beam current may be performed, while monitoring a neutron ray which is generated in at least one of the beam acceleration unit 14 and the beam deflection unit 16 by using the first neutron ray measuring instrument 51 and the second neutron ray measuring instrument 52. In this way, in a case where the measurement value in the first neutron ray measuring instrument 51 or the second neutron ray measuring instrument 52 exceeds the upper limit value, it can be detected that some abnormality has occurred in the adjustment process of the first operation mode or the second operation mode.

In the case of the third operation mode in FIG. 11, since the second Faraday cup 31 can serve as a main neutron ray source, it can be said that a state is normal where a neutron ray is not detected by the first neutron ray measuring instrument 51 and the second neutron ray measuring instrument 52, or a trace amount of neutron ray can be detected by the first neutron ray measuring instrument 51 or the second neutron ray measuring instrument 52. For example, it can be said that a state is normal where the neutron dose rate which is detected by the first neutron ray measuring instrument 51 disposed away from the second Faraday cup 31 is smaller than the neutron dose rate which is detected by the second neutron ray measuring instrument 52 disposed in the vicinity of the second Faraday cup 31. Therefore, in the third operation mode, the adjustment of the beam current may be performed while monitoring the neutron ray which is generated in the second Faraday cup 31 downstream of the energy analyzer by using the first neutron ray measuring instrument 51 and the second neutron ray measuring instrument 52.

In the case of the fourth operation mode in FIG. 12, since the beam monitor 42 can serve as a main neutron ray source, it can be said that a state is normal where while there is a possibility that a neutron ray may be detected by the third neutron ray measuring instrument 53 or the fourth neutron ray measuring instrument 54, a neutron ray is not detected by the first neutron ray measuring instrument 51 and the second neutron ray measuring instrument 52. Therefore, in the fourth operation mode, the upper limit values of the first neutron ray measuring instrument 51 and the second neutron ray measuring instrument 52 may be set to be relatively low (for example, close to a background noise level), and the upper limit values of the third neutron ray measuring instrument 53 and the fourth neutron ray measuring instrument 54 may be set to be relatively high. In the fourth operation mode, the adjustment of the beam current may be performed while monitoring the neutron ray which is generated in the beam monitor 42 by using the third neutron ray measuring instrument 53 and the fourth neutron ray measuring instrument 54.

In the case of the fifth operation mode in FIG. 13, since the beam dump 35 can serve as a main neutron ray source, it can be said that a state is normal where a neutron ray is not detected by the first neutron ray measuring instrument 51, the second neutron ray measuring instrument 52, and the third neutron ray measuring instrument 53, or a trace amount of neutron ray can be detected by the first neutron ray measuring instrument 51, the second neutron ray measuring instrument 52, or the third neutron ray measuring instrument 53. For example, it can be said that a state is normal where the neutron dose rate which is detected by the first neutron ray measuring instrument 51 or the second neutron ray measuring instrument 52 disposed away from the beam dump 35 is smaller than the neutron dose rate which is detected by the third neutron ray measuring instrument 53 disposed in the vicinity of the beam dump 35. Therefore, in the fifth operation mode, whether the ion beam is appropriately retracted may be monitored while measuring the neutron ray which is generated in the beam dump 35 by using the first neutron ray measuring instrument 51, the second neutron ray measuring instrument 52, and the third neutron ray measuring instrument 53. In the fifth operation mode, in a case where a neutron ray is detected by the fourth neutron ray measuring instrument 54, it may be considered that some abnormality has occurred in the beam retraction, and the loading and unloading of the wafer may be stopped.

In the case of the sixth operation mode in FIG. 14, since the left and right Faraday cups 39L and 39R and the beam monitor 42 can serve as main neutron ray sources, similar to the fourth operation mode, whether the ion implantation process is appropriately performed may be monitored while measuring the neutron ray by using the third neutron ray measuring instrument 53 and the fourth neutron ray measuring instrument 54. Even if a neutron ray is not generated in the left and right Faraday cups 39L and 39R and the beam monitor 42, in a case where abnormality occurs in the final energy filter 38 and the ultrahigh energy ion beam collides with the AEF electrode pair, there is a possibility that the final energy filter 38 may serve as a neutron ray source. In a case where a neutron ray is generated in the final energy filter 38 due to the occurrence of abnormality, it is assumed that the neutron dose rate which is detected by the third neutron ray measuring instrument 53 increases. Therefore, in a case where only the neutron dose rate which is measured by the third neutron ray measuring instrument 53 exceeds the upper limit value which is determined for the sixth operation mode, it may be considered that abnormality has occurred in the final energy filter 38, and the ion implantation process may be stopped.

The central control unit 50 may accumulate the measurement values in the plurality of neutron ray measuring instruments 51 to 54 and analyze the relationships between the measurement values in the respective measuring instruments or the transitions of the measurement values with time lapse in the plurality of operation modes described above. For example, the correlation data between the operation mode of the main body 58 and the measurement values in the plurality of neutron ray measuring instruments 51 to 54 in a specific operation mode may be accumulated, and the state of each device configuring the main body 58 may be estimated based on the accumulated correlation data. As the state of each device, for example, whether or not the situation requires maintenance at a certain point of time may be estimated, or the timing when maintenance is necessary in the future may be estimated. Since the neutron dose rate which can be generated in the neutron ray source can increase as the amount of boron which is accumulated in the neutron ray source increases according to secular use of the implanter, the necessity or timing of maintenance can be estimated by analyzing the increasing tendency of the neutron dose rate which is measured by the measuring instrument.

The central control unit 50 may detect abnormality of at least one measuring instrument itself, based on the operation mode of the main body 58 and the measurement values in the plurality of neutron ray measuring instruments 51 to 54 in a specific operation mode. In general, in order to detect abnormality of the neutron ray measuring instrument itself, it is necessary to dispose a plurality of neutron ray measuring instruments at the same position and measure neutron rays under the same condition. However, in a case where it is necessary to measure neutron rays at a plurality of locations because there are a plurality of neutron ray sources as in this embodiment, if a plurality of neutron ray measuring instruments are disposed at each of a plurality of locations, the cost increases significantly. Therefore, in this embodiment, abnormality of at least one neutron ray measuring instrument itself may be detected based on the measurement values in the plurality of neutron ray measuring instruments 51 to 54 which are disposed at different locations.

In each of the operation modes described above, since a location which can serve as a main neutron ray source is determined for each operation mode and the distance from the neutron ray source to each of the neutron ray measuring instruments 51 to 54 is also fixed, the ratios between the respective measurement values in the neutron ray measuring instruments 51 to 54 in a specific operation mode become almost constant. Therefore, in a case where there is a measurement value that deviates from the ratios between the respective measurement values in the neutron ray measuring instruments 51 to 54 which are determined for each operation mode, abnormality of the measuring instrument itself can be detected or the measuring instrument in which abnormality has occurred can be estimated. Further, the measuring instrument in which abnormality has occurred may be estimated by calculating and comparing the ratios between the respective measurement values in the neutron ray measuring instruments 51 to 54 in a plurality of operation modes.

According to this embodiment, since locations that can serve as neutron ray sources are estimated according to operation modes, neutron rays in the implanter can be appropriately monitored by using the neutron ray measuring instruments 51 to 54 which are disposed at a plurality of positions (for example, four positions), and the number of those is smaller than the assumed number of neutron ray sources (for example, eight positions). That is, the number of neutron ray measuring instruments can be reduced compared to a case where neutron ray measuring instruments are disposed to correspond to each of a plurality of neutron ray sources on a one-to-one basis, and thus an increase in cost due to the disposition of a large number of neutron ray measuring instruments can be prevented.

The present invention has been described above with reference to each of the embodiments described above. However, the present invention is not limited to each of the embodiments described above, and appropriate combinations or replacements of the configurations of respective embodiments are also included in the present invention. Further, it is also possible to appropriately rearrange the combinations or the processing orders in respective embodiments, based on the knowledge of those skilled in the art, or to add modifications such as various design changes to the embodiment, and embodiments to which such rearrangement or modifications are added can also be included in the scope of the present invention.

In the embodiments described above, a case where the plate-shaped or block-shaped neutron ray scattering member is mounted to the main body 58 or the enclosure 60 has been described. In a modification example, grain-type, gel-type, or paste-type neutron ray scattering member may be provided. For example, the gel-type or paste-type neutron ray scattering member may be applied to the surface of the main body 58 or the enclosure 60 or filled in a gap in the main body 58 or the enclosure 60. In addition, the grain-type neutron ray scattering member may be filled in a hollow portion in the support structure of the main body 58 or the enclosure 60.

An aspect of this embodiment is as follows.

(Item 1-1)

An ion implanter including:

a main body which includes a plurality of units which are disposed along a beamline along which an ion beam is transported, and a substrate transferring/processing unit which is disposed farthest downstream of the beamline, and has a neutron ray source in which a neutron ray can be generated due to collision of a ultrahigh energy ion beam;

an enclosure which at least partially encloses the main body; and a neutron ray scattering member which is disposed at a position where the neutron ray which is emitted from the neutron ray source can be incident in a direction in which a distance from the neutron ray source to the enclosure is equal to or less than a predetermined value.

(Item 1-2)

The ion implanter according to the item 1-1, in which the neutron ray scattering member includes a first neutron ray scattering member which is disposed at a position where the neutron ray which is emitted from the neutron ray source can be incident in a first direction in which a distance from the neutron ray source to the enclosure is a first distance, and a second neutron ray scattering member which is disposed at a position where the neutron ray which is emitted from the neutron ray source can be incident in a second direction in which a distance from the neutron ray source to the enclosure is a second distance larger than the first distance, and has a smaller thickness than the first neutron ray scattering member.

(Item 1-3)

The ion implanter according to the item 1-1 or 1-2, in which the neutron ray scattering member is disposed at a position where the neutron ray which is emitted from the neutron ray source can be incident in a first direction in which a distance from the neutron ray source to the enclosure is a first distance, and is not disposed at a position where the neutron ray which is emitted from the neutron ray source can be incident in a third direction in which a distance from the neutron ray source to the enclosure is a third distance larger than the first distance.

(Item 1-4)

The ion implanter according to any one of the item 1-1 to the item 1-3, in which the neutron ray source is at least one of a slit, a beam monitor, and a beam dump which are provided in the beamline.

(Item 1-5)

The ion implanter according to any one of the item 1-1 to the item 1-4, in which at least apart of the neutron ray scattering member is mounted to the enclosure.

(Item 1-6)

The ion implanter according to the item 1-5, in which at least a part of the neutron ray scattering member is mounted to a door which is provided in the enclosure.

(Item 1-7)

The ion implanter according to any one of the item 1-1 to the item 1-6, in which at least apart of the neutron ray scattering member is mounted to at least one of the main body and a support structure for the main body.

(Item 1-8)

The ion implanter according to any one of the item 1-1 to the item 1-7, in which the neutron ray scattering member is not mounted to a part of the enclosure which is disposed along a partial section of the beamline.

(Item 1-9)

The ion implanter according to the item 1-8, in which the plurality of units include a beam acceleration unit that accelerates an ion beam which is extracted from an ion source to generate the ultrahigh energy ion beam, and a beam transport unit that transports the ultrahigh energy ion beam toward the substrate transferring/processing unit, and the neutron ray scattering member is at least partially mounted to a part of the enclosure which is disposed along the beam transport unit, and is at least partially not mounted to a part of the enclosure which is disposed along the beam acceleration unit.

(Item 1-10)

The ion implanter according to the item 1-9, in which the plurality of units further include a beam deflection unit that connects the beam acceleration unit and the beam transport unit, the beamline is formed in a U shape by the beam acceleration unit having a linear shape, the beam deflection unit having a curved shape, and the beam transport unit having a linear shape, and the neutron ray scattering member is at least partially mounted to a part of the enclosure which is disposed along the beam deflection unit.

(Item 1-11)

The ion implanter according to any one of the item 1-1 to the item 1-10, in which the substrate transferring/processing unit includes an implantation process chamber in which an implantation process for irradiating a wafer with the ultrahigh energy ion beam is performed, a load port on which a wafer cassette accommodating a plurality of wafers is placed, and a substrate transfer device which transfers the wafer between the implantation process chamber and the wafer cassette, the enclosure has a wafer cassette transfer port configured to allow the wafer cassette to pass in a vertical direction vertically above the load port, and the neutron ray scattering member is disposed so as not to interfere with transfer of the wafer cassette in the wafer cassette transfer port.

(Item 1-12)

The ion implanter according to the item 1-11, in which parts of the neutron ray scattering members are disposed so as to overlap in a horizontal direction with the wafer cassette transfer port interposed therebetween.

(Item 1-13)

The ion implanter according to the item 1-11 or 1-12, in which the enclosure has a doorway which is provided in front of the load port, one hinged door which closes a right end or a left end of the doorway, and two slide doors which close a remaining region of the doorway which is not closed by the hinged door, and the neutron ray scattering member is mounted to both the hinged door and the slide doors.

(Item 1-14)

The ion implanter according to the item 1-11 or 1-12, in which the enclosure has a doorway which is provided in front of the load port, two hinged doors which close a right end and a left end of the doorway, and one slide door which closes a center region of the doorway which is not closed by the two hinged doors, and the neutron ray scattering member is mounted to both the hinged doors and the slide door.

(Item 1-15)

The ion implanter according to any one of the item 1-1 to the item 1-14, in which the enclosure includes a side wall portion which is provided on a horizontal side of the main body, a ceiling portion which is provided vertically above the main body, and a floor portion which is provided vertically below the main body, and each of the side wall portion, the ceiling portion, and the floor portion has a section to which the neutron ray scattering member is mounted, and a section to which the neutron ray scattering member is not mounted.

(Item 1-16)

The ion implanter according to any one of the item 1-1 to the item 1-15, in which the neutron ray scattering member is made of a material having a hydrogen atom content in a range from 0.08 g/cm$^3$ to 0.15 g/cm$^3$.

(Item 1-17)

The ion implanter according to any one of the item 1-1 to the item 1-16, in which the neutron ray scattering member includes polyolefin.

(Item 1-18)

The ion implanter according to the item 1-17, in which the neutron ray scattering member further includes a predetermined amount of boron atoms.

(Item 1-19)

The ion implanter according to any one of the item 1-1 to the item 1-18, in which at least a part of the neutron ray scattering member is plate-shaped or block-shaped.

(Item 1-20)

The ion implanter according to the item 1-19, in which an incombustible sheet is attached to a surface of the plate-shaped or block-shaped neutron ray scattering member.

(Item 1-21)

The ion implanter according to any one of the item 1-1 to the item 1-20, in which at least a part of the neutron ray scattering member is grain-type, gel-type, or paste-type.

(Item 1-22)

The ion implanter according to any one of the item 1-1 to the item 1-21, further including an X-ray shielding member which is mounted to the enclosure.

(Item 1-23)

The ion implanter according to any one of the item 1-1 to the item 1-22, in which the ultrahigh energy ion beam includes boron ions which have an energy of 4 MeV or higher.

Another aspect of this embodiment is as follows.

(Item 2-1)

An ion implanter including:

a plurality of devices which are disposed along a beamline along which an ion beam is transported;

a plurality of neutron ray measuring instruments which are disposed at a plurality of positions in the vicinity of the beamline and measure neutron rays which can be generated at a plurality of locations of the beamline due to collision of a ultrahigh energy ion beam; and a control device which monitors at least one of the plurality of devices, based on a measurement value in at least one of the plurality of neutron ray measuring instruments.

(Item 2-2)

The ion implanter according to the item 2-1, in which the control device estimates a position of at least one of neutron ray sources in the beamline, based on measurement values in the plurality of neutron ray measuring instruments.

(Item 2-3)

The ion implanter according to the item 2-1 or 2-2, in which the control device estimates intensity of a neutron ray which is emitted from at least one of neutron ray sources in the beamline, based on measurement values in the plurality of neutron ray measuring instruments.

(Item 2-4)

The ion implanter according to any one of the item 2-1 to the item 2-3, in which at least one of the plurality of neutron ray measuring instruments is disposed in the vicinity of at least one of a slit, a beam monitor, and a beam dump which are provided in the beamline.

(Item 2-5)

The ion implanter according to any one of the item 2-1 to the item 2-4, in which the control device detects abnormality of at least one of the plurality of devices, based on information on operation modes of the plurality of devices and a measurement value in at least one neutron ray measuring instrument in a specific operation mode.

(Item 2-6)

The ion implanter according to the item 2-5, in which in a case where the measurement value in the at least one neutron ray measuring instrument exceeds a reference value which is determined corresponding to the specific operation mode, the control device changes an operation condition of at least one of the plurality of devices such that the measurement value is equal to or less than the reference value.

(Item 2-7)

The ion implanter according to any one of the item 2-1 to the item 2-6, in which the control device accumulates correlation data between operation modes of the plurality of devices and measurement values in the plurality of neutron ray measuring instruments in a specific operation mode, and estimates a device that needs maintenance among the plurality of devices, based on the accumulated correlation data.

(Item 2-8)

The ion implanter according to the item 2-7, in which the control device estimates a maintenance timing of at least one of the plurality of devices, based on the accumulated correlation data.

(Item 2-9)

The ion implanter according to any one of the item 2-1 to the item 2-8, in which the control device detects abnormality of at least one of the plurality of devices, based on information on operation modes of the plurality of devices and measurement values in at least two or more neutron ray measuring instruments in a specific operation mode.

(Item 2-10)

The ion implanter according to any one of the item 2-1 to the item 2-9, in which the plurality of devices include a beam acceleration unit that generates the ultrahigh energy ion beam by accelerating an ion beam which is extracted from an ion source, and an energy analyzer which is disposed downstream of the beam acceleration unit, and the control device adjusts at least one of an energy and a beam current of an ion beam which exits from the energy analyzer, while monitoring neutron rays which can be generated in at least one of the beam acceleration unit and the energy analyzer, by using at least two or more neutron ray measuring instruments.

(Item 2-11)

The ion implanter according to the item 2-10, in which the plurality of neutron ray measuring instruments include a first neutron ray measuring instrument which is disposed in the vicinity of a slit which is provided at an exit of the beam acceleration unit, and a second neutron ray measuring instrument which is disposed in the vicinity of a slit and a beam monitor which are provided at an exit of the energy analyzer, and the control device monitors neutron rays which can be generated in at least one of the beam acceleration unit and the energy analyzer, by using the first neutron ray measuring instrument and the second neutron ray measuring instrument.

(Item 2-12)

The ion implanter according to the item 2-11, in which the control device monitors neutron rays which can be generated downstream of the energy analyzer in the beamline, by using the first neutron ray measuring instrument and the second neutron ray measuring instrument.

(Item 2-13)

The ion implanter according to any one of the item 2-1 to the item 2-12, in which the plurality of devices include a beam deflector which applies at least one of an electric field and a magnetic field to the ion beam and retracts the ion beam toward a beam dump which is provided away from the beamline, and the control device monitors neutron rays which can be generated in the beam dump when the ion beam is retracted by the beam deflector, by using at least two or more neutron ray measuring instruments.

(Item 2-14)

The ion implanter according to any one of the item 2-1 to the item 2-13, in which the plurality of neutron ray measuring instruments include a third neutron ray measuring instrument which is disposed upstream of a beam monitor which is provided in the vicinity of an implantation position where a wafer which is irradiated with the ion beam is disposed, and a fourth neutron ray measuring instrument which is disposed downstream of the beam monitor which is provided in the vicinity of the implantation position, and the control device monitors neutron rays which can be generated in the beam monitor which is provided in the vicinity of the implantation position, by using the third neutron ray measuring instrument and the fourth neutron ray measuring instrument.

(Item 2-15)

The ion implanter according to any one of the item 2-1 to the item 2-14, in which the control device detects abnormality of at least one neutron ray measuring instrument itself, based on information on operation modes of the plurality of devices and measurement values in the plurality of neutron ray measuring instruments in a specific operation mode.

(Item 2-16)

The ion implanter according to any one of the item 2-1 to the item 2-15, further including:

an enclosure which encloses the plurality of devices and the plurality of neutron ray measuring instruments, in which the control device estimates a neutron dose rate outside of the enclosure, based on measurement values in the plurality of neutron ray measuring instruments.

(Item 2-17)

The ion implanter according to the item 2-16, in which the control device estimates the neutron dose rate outside of the enclosure, based on disposition of at least one of a neutron ray scattering material which is included in the enclosure and a neutron ray scattering material which is disposed in the vicinity of the beamline.

(Item 2-18)

The ion implanter according to the item 2-16 or 2-17, in which in a case where the estimated neutron dose rate outside of the enclosure exceeds a predetermined upper limit value, the control device changes an operation condition of at least one of the plurality of devices such that the neutron dose rate outside of the enclosure is lowered.

(Item 2-19)

The ion implanter according to any one of the item 2-16 to the item 2-18, in which the control device estimates a dose rate distribution of neutron rays inside of the enclosure, based on measurement values in the plurality of neutron ray measuring instruments.

(Item 2-20)

The ion implanter according to any one of the item 2-1 to the item 2-19, in which the ultrahigh energy ion beam includes boron (B) ions which have an energy of 4 MeV or higher.

(Item 2-21)

An ion implantation method including:

measuring neutron rays which can be generated at a plurality of locations of a beamline due to collision of a ultrahigh energy ion beam, by using a plurality of neutron ray measuring instruments which are disposed at a plurality of positions in the vicinity of the beamline along which an ion beam is transported; and monitoring at least one of a plurality of devices which are disposed along the beamline, based on a measurement value in at least one of the plurality of neutron ray measuring instruments.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a main body which includes a plurality of units which are disposed along a beamline along which an ion beam is transported, and a substrate transferring/processing unit which is disposed farthest downstream of the beamline, and has a neutron ray source in which a neutron ray is generated due to collision of a ultrahigh energy ion beam;
an enclosure which at least partially encloses the main body; and
a neutron ray scattering member which is disposed at a position where the neutron ray which is emitted from the neutron ray source is incident in a direction in which a distance from the neutron ray source to the enclosure is equal to or less than a predetermined value.

2. The ion implanter according to claim 1, wherein the neutron ray scattering member includes a first neutron ray scattering member which is disposed at a position where the neutron ray which is emitted from the neutron ray source is incident in a first direction in which a distance from the neutron ray source to the enclosure is a first distance, and a second neutron ray scattering member which is disposed at a position where the neutron ray which is emitted from the neutron ray source is incident in a second direction in which a distance from the neutron ray source to the enclosure is a second distance larger than the first distance, and has a smaller thickness than the first neutron ray scattering member.

3. The ion implanter according to claim 1, wherein the neutron ray scattering member is disposed at a position where the neutron ray which is emitted from the neutron ray source is incident in a first direction in which a distance from the neutron ray source to the enclosure is a first distance, and is not disposed at a position where the neutron ray which is emitted from the neutron ray source is incident in a third direction in which a distance from the neutron ray source to the enclosure is a third distance larger than the first distance.

4. The ion implanter according to claim 1, wherein the neutron ray source is at least one of a slit, a beam monitor, and a beam dump which are provided in the beamline.

5. The ion implanter according to claim 1, wherein at least a part of the neutron ray scattering member is mounted to the enclosure.

6. The ion implanter according to claim 5, wherein at least a part of the neutron ray scattering member is mounted to a door which is provided in the enclosure.

7. The ion implanter according to claim 1, wherein at least a part of the neutron ray scattering member is mounted to at least one of the main body and a support structure for the main body.

8. The ion implanter according to claim 1, wherein the neutron ray scattering member is not mounted to a part of the enclosure which is disposed along a partial section of the beamline.

9. The ion implanter according to claim 8, wherein the plurality of units include a beam acceleration unit that accelerates an ion beam which is extracted from an ion source to generate the ultrahigh energy ion beam, and a beam transport unit that transports the ultrahigh energy ion beam toward the substrate transferring/processing unit, and
the neutron ray scattering member is at least partially mounted to a part of the enclosure which is disposed along the beam transport unit, and is at least partially not mounted to a part of the enclosure which is disposed along the beam acceleration unit.

10. The ion implanter according to claim 9, wherein the plurality of units further include a beam deflection unit that connects the beam acceleration unit and the beam transport unit,
the beamline is formed in a U shape by the beam acceleration unit having a linear shape, the beam deflection unit having a curved shape, and the beam transport unit having a linear shape, and
the neutron ray scattering member is at least partially mounted to a part of the enclosure which is disposed along the beam deflection unit.

11. The ion implanter according to claim 1, wherein the substrate transferring/processing unit includes an implantation process chamber in which an implantation process for irradiating a wafer with the ultrahigh energy ion beam is performed, a load port on which a wafer cassette accommodating a plurality of wafers is placed, and a substrate transfer device which transfers the wafer between the implantation process chamber and the wafer cassette,
the enclosure has a wafer cassette transfer port configured to allow the wafer cassette to pass in a vertical direction vertically above the load port, and
the neutron ray scattering member is disposed so as not to interfere with transfer of the wafer cassette in the wafer cassette transfer port.

12. The ion implanter according to claim 11, wherein parts of the neutron ray scattering members are disposed so as to overlap each other in a horizontal direction with the wafer cassette transfer port interposed therebetween.

13. The ion implanter according to claim 11, wherein the enclosure has a doorway which is provided in front of the load port, one hinged door which closes a right end or a left end of the doorway, and two slide doors which close a remaining region of the doorway which is not closed by the hinged door, and the neutron ray scattering member is mounted to both the hinged door and the slide doors.

14. The ion implanter according to claim 11, wherein the enclosure has a doorway which is provided in front of the load port, two hinged doors which close a right end and a left end of the doorway, and one slide door which closes a center region of the doorway which is not closed by the two hinged doors, and the neutron ray scattering member is mounted to both the hinged doors and the slide door.

15. The ion implanter according to claim 1, wherein the enclosure includes a side wall portion which is provided on a horizontal side of the main body, a ceiling portion which is provided vertically above the main body, and a floor portion which is provided vertically below the main body, and each of the side wall portion, the ceiling portion, and the floor portion has a section to which the neutron ray scattering member is mounted, and a section to which the neutron ray scattering member is not mounted.

16. The ion implanter according to claim 1, wherein the neutron ray scattering member is made of a material having a hydrogen atom content in a range from 0.08 $g/cm^3$ to 0.15 $g/cm^3$.

17. The ion implanter according to claim 1, wherein the neutron ray scattering member includes polyolefin.

18. The ion implanter according to claim 17, wherein the neutron ray scattering member further includes a predetermined amount of boron atoms.

19. The ion implanter according to claim 1, wherein at least a part of the neutron ray scattering member is plate-shaped or block-shaped.

20. The ion implanter according to claim 19, wherein an incombustible sheet is attached on a surface of the plate-shaped or block-shaped neutron ray scattering member.

21. The ion implanter according to claim 1, wherein at least a part of the neutron ray scattering member is grain-type, gel-type, or paste-type.

22. The ion implanter according to claim 1, further comprising:

an X-ray shielding member which is mounted to the enclosure.

23. The ion implanter according to claim 1, wherein the ultrahigh energy ion beam includes boron ions each of which has an energy of 4 MeV or higher.

* * * * *